(12) United States Patent
Li et al.

(10) Patent No.: US 12,224,366 B2
(45) Date of Patent: Feb. 11, 2025

(54) MANUFACTURING METHOD AND MANUFACTURING APPARATUS FOR INTERCONNECTION MEMBER

(71) Applicant: LONGI SOLAR TECHNOLOGY (TAIZHOU) CO., LTD., Jiangsu (CN)

(72) Inventors: Hua Li, Jiangsu (CN); Yong Wang, Jiangsu (CN); Peng Chen, Jiangsu (CN); Debao Zhao, Jiangsu (CN); Jun Chen, Jiangsu (CN); Jiyu Liu, Jiangsu (CN)

(73) Assignee: LONGI SOLAR TECHNOLOGY (TAIZHOU) CO., LTD., Jiangsu (CN)

( * ) Notice: Subject to any disclaimer, the term of this patent is extended or adjusted under 35 U.S.C. 154(b) by 0 days.

(21) Appl. No.: 18/023,518

(22) PCT Filed: Nov. 23, 2020

(86) PCT No.: PCT/CN2020/130886
§ 371 (c)(1),
(2) Date: Feb. 27, 2023

(87) PCT Pub. No.: WO2022/041515
PCT Pub. Date: Mar. 3, 2022

(65) Prior Publication Data
US 2023/0275172 A1    Aug. 31, 2023

(30) Foreign Application Priority Data
Aug. 31, 2020 (CN) .......................... 202010901302.1

(51) Int. Cl.
*H01L 31/05* (2014.01)
*H01L 31/02* (2006.01)
*H01L 31/18* (2006.01)

(52) U.S. Cl.
CPC ...... *H01L 31/0516* (2013.01); *H01L 31/0201* (2013.01); *H01L 31/18* (2013.01)

(58) Field of Classification Search
None
See application file for complete search history.

(56) References Cited

U.S. PATENT DOCUMENTS

2005/0268959 A1    12/2005   Aschenbrenner et al.
2009/0266579 A1*   10/2009   Hofmuller .......... H01L 31/0508
                                                    174/126.1

(Continued)

FOREIGN PATENT DOCUMENTS

CN    102576756 A    7/2012
CN    103426960 A    12/2013

(Continued)

OTHER PUBLICATIONS

International Search Report for Application No. PCT/CN2020/130889, mailed Jun. 4, 2021 (4 pages).

(Continued)

*Primary Examiner* — Eli S Mekhlin
(74) *Attorney, Agent, or Firm* — NIXON PEABODY LLP; Jeffrey L. Costellia

(57) ABSTRACT

The present disclosure discloses a manufacturing method and a manufacturing device for an interconnection piece. The manufacturing method comprises providing a solder strip, and performing forming treatment on the solder strip to obtain a plurality of structural solder strips; and providing a flexible insulating substrate, and compounding the plurality of structural solder strips on the flexible insulating substrate at intervals to obtain the interconnection piece. Each structural solder strip is provided with two soldering portions and a connecting portion located between the two soldering portions, and the connecting portion is respectively connected to the two soldering portions; at least a part (Continued)

of the connecting portion is located on the flexible insulating substrate, and the two soldering portions extend out of the flexible insulating substrate.

6 Claims, 14 Drawing Sheets

(56) References Cited

U.S. PATENT DOCUMENTS

| 2010/0144218 A1 | 6/2010 | Rose et al. |
| 2013/0081675 A1* | 4/2013 | Joe .................. H01L 31/0682 136/251 |
| 2013/0340804 A1 | 12/2013 | Moon et al. |

FOREIGN PATENT DOCUMENTS

| CN | 103840025 | 6/2014 |
| CN | 103972316 | 8/2014 |
| CN | 104919597 A | 9/2015 |
| CN | 106489211 A | 3/2017 |
| CN | 109346547 | 2/2019 |
| CN | 110783429 | 2/2020 |
| CN | 111261750 A | 6/2020 |
| CN | 212934638 U | 4/2021 |
| JP | 2000-323208 A | 11/2000 |
| JP | 2007-059475 A | 3/2007 |
| JP | 2008-502149 A | 1/2008 |
| JP | 2012-164954 A | 8/2012 |
| JP | 2013-232496 A | 11/2013 |
| JP | 2014-007384 A | 1/2014 |
| JP | 2018-507545 A | 3/2018 |
| WO | 2013-077111 A1 | 5/2013 |

OTHER PUBLICATIONS

Japanese Office Action for App. No. 2023-514088, dated Jul. 23, 2024 (12 Pages).
Japanese Office Action for App. No. 2023-514088, mailed Mar. 7, 2024 (10 pages) [English Translation].
Extended European Search Report for European Patent App. No. 20951183.1, mailed Sep. 13, 2024 (9 pages).
Chinese Office Action (Application No. 202010901302.1) mailed Oct. 17, 2024.

* cited by examiner

MANUFACTURING METHOD AND MANUFACTURING APPARATUS FOR INTERCONNECTION MEMBER

CROSS-REFERENCE TO RELEVANT APPLICATIONS

The present disclosure claims the priority of the Chinese patent application filed on Aug. 31, 2020 before the CNIPA, China National Intellectual Property Administration with the application number of 202010901302.1 and the title of "MANUFACTURING METHOD AND MANUFACTURING APPARATUS FOR INTERCONNECTION MEMBER", which is incorporated herein in its entirety by reference.

TECHNICAL FIELD

The present disclosure relates to the technical field of photovoltaics and, more particularly, to a manufacturing method and a manufacturing device for an interconnection piece.

BACKGROUND

Back-contact cell is a cell in which both an anode and a cathode of a solar cell are located on a back of the solar cell, and may be interconnected by using a solder strip. The back-contact cell not only completely eliminates light-shading losses of a front grid electrode, but also improves cell efficiency and makes the cell more beautiful.

However, since the anode and the cathode of the back-contact cell are both located on the back of the back-contact cell, a thermal expansion coefficient of the solder strip is quite different from that of a cell piece. Therefore, when the solder strip is soldered on a pad of the back-contact cell, heat released by soldering makes the solder strip expand, and after the soldering is finished, the solder strip shrinks due to temperature drop, which leads to serious bending deformation of the back-contact cell, thus affecting a series-soldering stability and increasing a risk of fragments and hidden cracks in an assembly process. Therefore, it is urgent to find an interconnection piece capable of replacing the solder strip to realize the back-contact cell, so as to reduce a deformation degree of the back-contact cell during series-soldering.

In the prior art, a stress-deformation interconnection structure may be considered to eliminate deformation caused by stress in the soldering process, but a stress phase-change material in the stress-deformation interconnection structure is difficult to manufacture, which becomes a difficult problem for the application of the stress-deformation interconnection structure in the soldering process.

SUMMARY

The present disclosure aims at providing a manufacturing method and a manufacturing device for an interconnection piece to manufacture an interconnection piece with a stress buffering function, so as to limit a deformation degree of a back-contact cell during series soldering.

In a first aspect, the present disclosure provides a manufacturing method for an interconnection piece, including:
providing a solder strip and performing forming treatment on the solder strip to obtain a plurality of structural solder strips; wherein, each structural solder strip is provided with two soldering portions and a connecting portion located between the two soldering portions, and the connecting portion is respectively connected to the two soldering portions; and
providing a flexible insulating substrate, and compounding the plurality of structural solder strips on the flexible insulating substrate at intervals to obtain the interconnection piece; wherein, at least a part of the connecting portion is located on the flexible insulating substrate, and the two soldering portions extend out of the flexible insulating substrate.

With the foregoing technical solution, after the forming treatment is performed on the solder strip, the plurality of structural solder strips are compounded on the flexible insulating substrate at intervals to obtain the interconnection piece, so that at least a part of the connecting portion of each structural solder strip is located on the flexible insulating substrate. When a stress is generated by the structural solder strip due to a soldering process, a laminating process and a difference between outdoor high and low temperatures, the connection portion contained in the structural solder strip may transfer the stress to the flexible insulating substrate and release the stress through the flexible insulating substrate, thus reducing a bending deformation degree of the back-contact cell and improving soldering stability and long-term use stability. Meanwhile, the flexible insulating substrate plays a role in fixing and dust prevention on the plurality of structural solder strips in the soldering process, preventing a relative position deviation between the structural solder strips and the pads in the soldering process and particles generated by soldering from migrating to a front of the cell piece, thereby improving a soldering accuracy.

In addition, when the interconnection piece manufactured by the manufacturing method for the interconnection piece provided by the present disclosure is applied to interconnection between the back-contact cells, the interconnection piece can not only be used as a vertical conducting channel to realize the interconnection between the back-contact cells, but also can provide electrical isolation for areas of two back-contact cells except the pads by means of the flexible insulating substrate, thereby reducing a possibility of electric leakage and improving cell efficiency.

In a probable implementation, the connecting portion of each structural solder strips is provided with a hollow structure for releasing stress. When the stress is generated by the structural solder strip due to the soldering process, the laminating process and the difference between the outdoor high and low temperatures, the connection portion can not only transfer the stress to the flexible insulating substrate, but also the hollow structure can release a part of the stress, thus further reducing the bending deformation degree of the back-contact cell and improving the soldering stability and the long-term use stability.

In a probable implementation, the above hollow structure includes at least one through hole. A pattern of each through hole is a closed pattern. At this time, the closed pattern here refers to that an outline pattern of the hollow structure is closed. In this case, an edge outline of the connecting portion is complete, which can ensure that the structural solder strip has good strength.

The pattern of each through hole is a polygonal pattern, a circular pattern, an elliptical pattern or a special-shaped pattern. The polygonal pattern may be a triangle, a rectangle, a square, or the like.

In a probable implementation, the above hollow structure includes m rows of through holes, and m is an integer greater than or equal to 1. Each row of through holes includes at least one through hole. The first row of through holes and the m-th row of through holes are formed in the connecting portion along any direction parallel to the first forming portion.

In a probable implementation, m is an integer greater than or equal to 2, and two adjacent rows of through holes are distributed in a staggered manner. At this time, the m rows of through holes in the connecting portion can uniformly release the stress generated by the structural solder strips, and further reduce the deformation degree of the back-contact cell.

In a probable implementation, when the above-mentioned through holes are slit-type through holes or rectangular through holes, if a length direction of the through hole is from the distribution direction of the two soldering portions, then an interval between two rows of through holes may be adjusted, so that a current of one soldering portion can be transmitted to the other soldering portion through the connecting portion as linearly as possible, thereby reducing a current loss.

In a probable implementation, m is an integer greater than or equal to 3. A quantity of through holes included in the first row of through holes and a quantity of through holes in the m-th row of through holes are both greater than or equal to 2. In this case, along the distribution direction of the first row of through holes to the m-th row of through holes, a quantity of through holes included in each row of through holes decreases first and then increases.

With the foregoing technical solution, along the distribution direction of the first row of through holes to the m-th row of through holes, if the length of each row of through holes along the row direction decreases first and then increases, a structural strength of the connecting portion increases first and then decreases, and a stress of the connecting portion sequentially decreases first and then sequentially increases along the distribution direction of the first row of through holes to the m-th row of through holes. Based on this, a distribution manner of the through holes in the connecting portion may be used to adjust strength and a stress release capacity of each area of the connecting portion, so that the strength and the stress release capacity of the connecting portion achieve coordination.

In a probable implementation, when m is an integer greater than or equal to 3, the quantity of through holes included in the first row of through holes and the quantity of the m-th row of through holes are both greater than or equal to 1; along the distribution direction of the first row of through holes to the m-th row of through holes, the quantity of through holes included in each row of through holes increases first and then decreases.

With the foregoing technical solution, along the distribution direction of the first row of through holes to the m-th row of through holes, if the length of each row of through holes along the row direction decreases first and then increases, the structural strength of the connecting portion increases first and then decreases, and the stress of the connecting portion sequentially increases first and then sequentially decreases along the distribution direction of the first row of through holes to the m-th row of through holes. Based on this, a distribution manner of the through holes in the connecting portion may be used to adjust strength and a stress release capacity of each area of the connecting portion, so that the strength and the stress release capacity of the connecting portion achieve coordination.

In a probable implementation, central axes of the two soldering portions are collinear. In this case, a current flowing from one soldering portion to the other soldering portion may be conducted as nearly as straight as possible.

In a probable implementation, a width of each soldering portion is smaller than a maximum width of the connecting portion. Each soldering portion is connected to the connecting portion in an arc transition mode. When the arc transition mode is adopted, stress concentration at the arc transition is not easy to occur, thus further reducing the stress generated by the structural solder strip due to temperature change.

In a probable implementation, the flexible insulating substrate above is a light-shielding flexible insulating substrate. When the interconnection piece interconnects two adjacent back-contact cells, if the flexible insulating substrate is partially or completely located in a gap between the two adjacent back-contact cells, the flexible insulating substrate may be used as a visual shielding structure, so that the structural solder strip on the back of the solar cell assembly cannot be seen when viewed from the front of the solar cell assembly, thereby improving aesthetics of the solar cell assembly.

In a probable implementation, a material of the flexible insulating substrate may be an insulating polymer material. The insulating polymer material includes polyvinyl butyral (PVB), polyolefin (POE) or ethylene-vinyl acetate copolymer (EVA), and other polymer materials.

In a probable implementation, at least one surface of the flexible insulating substrate above is partially or completely provided with a shielding coating. A shielding effect of the shielding coating refers to the related description of the light-shielding flexible insulating substrate, which will not be elaborated here.

In a probable implementation, the flexible insulating substrate may be a single-sided adhesive tape or a double-sided adhesive tape.

With the foregoing technical solution, the flexible insulating substrate can be bonded with the back-contact cell, thus achieving a function of positioning the structural solder strips. In addition, when the interconnection piece is applied to the interconnection between the back-contact cells, if the flexible insulating substrate is located between two adjacent back-contact cells, the release layer of the single-sided adhesive tape or the double-sided adhesive tape can not only be used as a visual shielding layer to improve the aesthetics of the solar cell assembly, but also reduce particle pollution.

In a probable implementation, a mode of the forming treatment is a mechanical stamping mode, a chemical etching mode or a laser cutting mode.

In a probable implementation, a mode of compounding is a bonding mode. When each structural solder strip is bonded on the flexible insulating substrate, a binder may be a polymer binder, including but not limited to one or more of polyvinyl acetate, polyvinyl acetal, acrylate, polystyrene, epoxy resin, acrylic resin, polyurethane resin, unsaturated polyester, butyl rubber, nitrile rubber, phenolic-polyvinyl acetal and epoxy-polyamide.

In a probable implementation, the mode of compounding is a hot pressing mode. It is only required that a temperature of the hot pressing mode is guaranteed not to damage the flexible insulating material. For example, the hot pressing mode is performed at a hot pressing temperature ranging from 50° C. to 120° C., and the hot pressing lasts for 5 seconds to 30 seconds.

In a probable implementation, a surface of the connecting portion of each structural solder strip away from the flexible insulating substrate is exposed. In this case, each structural solder strip may be pressed to the flexible insulating substrate by using pressing bonding and other processes.

In a probable implementation, when the connecting portion of each structural solder strip is embedded in the flexible insulating substrate, at least a part of the connecting portion of each structural solder strip is wrapped in the flexible insulating substrate. In this case, the interconnection piece is a sandwich structure, and the flexible insulating substrate may be used to further fix the structural solder strip, which not only further reduces or eliminates possible displacement of the structural solder strip in the soldering process, but also eliminates a possibility of connection failure between the structural solder strip and the flexible insulating substrate when one soldering portion of the structural solder strip is stressed and warped, thus ensuring connection stability between the structural solder strip and the flexible insulating substrate.

In a probable implementation, a structure of the flexible insulating substrate above is a strip-shaped structure. The plurality of structural solder strips are distributed along a strip-shaped extension direction of the flexible insulating substrate at intervals.

In a probable implementation, the flexible insulating substrate above is internally provided with a conducting layer. The connecting portions of structural solder strips are electrically connected through the conducting layer. The conducting layer may be a conducting ribbon or a conducting particle layer composed of metal particles in contact with each other.

With the foregoing technical solution, the conducting layer above can electrically connect the conducting layers contained in each structural solder strip together, so that the conducting layers may be used as transverse conducting channel. When one soldering portion contained in one structural solder strip in the plurality of structural solder strips has poor soldering with a corresponding polar pad, the structural solder strip is partially failed as a vertical conducting channel, but the structural solder strip can also conduct a current to other well-soldered structural solder strips by using the conducting layer, thus avoiding a problem of cell efficiency reduction when the vertical conductive channel is partially failed, thereby improving connection reliability of the interconnection piece.

In a probable implementation, performing forming treatment on the solder strip to obtain the plurality of structural solder strips includes:

mechanically stamping the solder strip along a length direction of the solder strip to form a plurality of structural solder strips connected together; and separating the plurality of structural solder strips connected together by using a cutting mode.

In a probable implementation, compounding the plurality of structural solder strips on the flexible insulating substrate at intervals to obtain the interconnection piece includes: pressing the plurality of structural solder strips on the flexible insulating substrate at intervals to obtain the interconnection piece.

In a second aspect, the present disclosure further provides a manufacturing device for an interconnection piece, including: a solder strip unwinding apparatus, a substrate unwinding apparatus, a stamping forming apparatus, a material compounding apparatus and a winding apparatus. The solder strip unwinding apparatus is configured for providing a solder strip to a stamping forming apparatus; and configured for providing a flexible insulating substrate to the material compounding apparatus; and the stamping forming apparatus is configured for performing forming treatment on the solder strip to obtain a plurality of structural solder strips. The material compounding apparatus is configured for compounding the plurality of structural solder strips on the flexible insulating substrate at intervals to obtain the interconnection piece; and the winding apparatus is configured for winding the interconnection piece.

At least a part of the connecting portion of each structural solder strip included in the interconnection piece is located on the flexible insulating substrate, and the two soldering portions extend out of the flexible insulating substrate.

The stamping forming apparatus includes a forming die, and the forming die includes an upper stamping die and a lower stamping die. The upper stamping die and the lower stamping die are provided with a first forming portion configured for forming a connecting portion, and two second forming portions configured for forming a soldering portion; and the first forming portion is located between the two second forming portions, and the first forming portion is respectively connected to the second forming portions.

With the adoption of the technical solution, the solder strip unwinding apparatus can provide the solder strips to the stamping forming apparatus, thus realizing automatic feeding of the stamping forming apparatus, and enabling the stamping forming apparatus to continuously stamping the solder strips continuously. The upper stamping die and the lower stamping die are each provided with the first forming portion configured for forming the connecting portion, and the two second forming portions configured for forming the soldering portion. Because the first forming portion is located between the two second forming portions, and the first forming portion is respectively connected to the second forming portions, when the stamping forming apparatus is used to perform forming treatment on the solder strips, a plurality of structural solder strips can be formed by stamping on the solder strips. In this case, each structural solder strip includes the connecting portion corresponding to the first forming portion and the two soldering portions corresponding to the two second forming portions, and the connecting portion is located between the two soldering portions and connected to the two soldering portions. Based on this, the substrate unwinding apparatus can provide the flexible insulating substrate to the material compounding apparatus; therefore, when the stamping forming apparatus can continuously stamping the structural solder strips, the material compounding apparatus can realize the automatic feeding of the flexible insulating substrate, so that the plurality of structural solder strips can be continuously compounded on the flexible insulating substrate at intervals by using the material compounding apparatus, thus obtaining the interconnection piece. Furthermore, at least a part of the connecting portion of each structural solder strip can be partially located on the flexible insulating substrate, so that the obtained interconnection piece has good flexibility. Therefore, the material compounding apparatus may continuously compound the plurality of structural solder strips on the flexible insulating substrate at intervals, and the winding apparatus may wind the interconnection pieces, so as to realize rolling packaging of the interconnection pieces. Therefore, the manufacturing device for the interconnection piece provided by the present disclosure can realize continuous mass production of the interconnection pieces, which is beneficial to the mass production of the interconnection pieces.

More importantly, because at least a part of the connecting portion of each structural solder strip may be partially located on the flexible insulating substrate, such that a stress is generated by the structural solder strip due to a soldering process, a laminating process and a difference between outdoor high and low temperatures; the connection portion contained in the structural solder strip may transfer the stress to the flexible insulating substrate and release the stress through the flexible insulating substrate. Therefore, the interconnection piece manufactured by the manufacturing device for the interconnection piece provided by the present disclosure can reduce a bending deformation degree of the back-contact cell and improving soldering stability and long-term use stability. Meanwhile, the flexible insulating substrate plays a role in fixing and dust prevention on the plurality of structural solder strips in the soldering process, preventing a relative position deviation between the structural solder strips and the pads in the soldering process and particles generated by soldering from migrating to a front of the cell piece, thereby improving a soldering accuracy.

In addition, when the interconnection piece manufactured by the manufacturing device for the interconnection piece provided by the present disclosure is applied to interconnection between the back-contact cells, the interconnection piece can not only be used as a vertical conducting channel to realize the interconnection between the back-contact cells, but also can provide electrical isolation for areas of two adjacent back-contact cells except the pads by means of the flexible insulating substrate, thereby reducing a possibility of electric leakage and improving cell efficiency.

In a probable implementation, central axes of the two second forming portions are collinear. When the solder strip is stamped by the stamping forming apparatus, the central axes of the two soldering portions included in the formed structural solder strip are collinear, and the effect thereof is referred to the corresponding description above.

In a probable implementation, a width of each second forming portion is smaller than a width of the first forming portion, and each second forming portion is connected to the first forming portion in an arc transition mode. When the solder strip is stamped by using the stamping forming apparatus, the first soldering portion and the second soldering portion included in the formed structural solder strip are both connected to the connecting portion in the arc transition mode, and the effect thereof is referred to the corresponding description above.

In a probable implementation, the upper stamping die and the lower stamping die are also provided with a third forming portion located in the first forming portion. The third forming portion is configured for forming a hollow structure for releasing stress in the connecting portion. When the solder strip is stamped by the stamping forming apparatus, the connecting portion included in the formed structural solder strip is provided with the hollow structure, and the beneficial effect thereof is referred to the corresponding description above.

In a probable implementation, the third forming portion comprises at least one hole forming portion. A pattern of each hole forming portion is a closed pattern, and the beneficial effect thereof is referred to the description above. For example, the pattern of each hole forming portion is a polygonal pattern, a circular pattern, an elliptical pattern or a special-shaped pattern. The effect herein thereof is referred to the description related to the pattern of the hollow structure above.

In a probable implementation, the third forming portion includes m rows of hole forming portions, and m is an integer greater than or equal to 1. Each row of hole forming portions comprises at least one hole forming portion, and the first row of hole forming portions and the m-th row of hole forming portions are formed in the first forming portion along any direction parallel to the first forming portion.

In a probable implementation when m is an integer greater than or equal to 2, two adjacent rows of through holes are distributed in a staggered manner and the effect thereof is referred to the related description above.

In a probable implementation, m is an integer greater than or equal to 3. A quantity of hole forming portions included in the first row of hole forming portions and a quantity of hole forming portions in the m-th row of hole forming portions are both greater than or equal to 2. In this case, along the distribution direction of the first row of hole forming portions to the m-th row of hole forming portions, a quantity of hole forming portions included in each row of hole forming portions decreases first and then increases. The effect here is referred to the related description above.

In a probable implementation, when the first row of hole forming portions and the m-th row of hole forming portions are formed in the first forming portion along the distribution direction of the two second forming portions, along the distribution direction of the first row of hole forming portions to the m-th row of hole forming portions, a quantity of the hole forming portions included in each row of hole forming portions decreases first and then increases, and a distance between the front and rear ends of each row of hole forming portions and an edge of the first forming portion decreases first and then increases.

In a probable implementation, when the quantity of hole forming portions included in the first row of hole forming portions and the quantity of hole forming portions in the m-th row of hole forming portions are both greater than or equal to 1. And along the distribution direction of the first row of hole forming portions to the m-th row of hole forming portions, the quantity of hole forming portions included in each row of hole forming portions increases first and then decreases.

In a probable implementation, the stamping forming apparatus further includes a stamping press. The upper stamping die is arranged on the stamping press. The stamping press is configured for controlling the upper stamping die and the lower stamping die to perform closing and demoulding.

In a probable implementation, the stamping forming apparatus further includes a solder strip straightening roller and a solder strip pulling roller. The forming die is located between the solder strip straightening roller and the solder strip pulling roller. When the stamping press is used to control the upper stamping die to perform demoulding, the solder strip straightening roller is used to correct a position of the solder strip, and the solder strip pulling roller is used to pull the solder strip, so that a part of the solder strip needing to be stamped accurately falls between the upper stamping die and the lower stamping die, thus ensuring that the stamping forming apparatus normally stamps the solder strip.

In a probable implementation, when the plurality of structural solder strips are connected together, the manufacturing device for the interconnection piece above further includes: a first industrial robot and a cutting mechanism located between the stamping forming apparatus and the material compounding apparatus. The first industrial robot is configured for pulling the plurality of structural solder strips connected together to a cutting station of a cutting mechanism when the upper stamping die and the lower stamping die are demoulded. The cutting mechanism is configured for separating the plurality of structural solder strips connected together at the cutting station of the cutting mechanism to form a plurality of structural solder strips.

With the foregoing technical solution, after the cutting mechanism completes the separation of the structural solder strip once, the first industrial robot can pull the remaining structural solder strips connected together to the cutting station of the cutting mechanism, so that the process of cutting the structural solder strips is automated.

In a probable implementation, the manufacturing device for the interconnection piece above further includes: an image sensor and a controller communicated with the image sensor and the cutting mechanism. The image sensor is configured for collecting images of the plurality of structural solder strips connected together at the cutting station of the cutting mechanism. The controller is configured for controlling the cutting mechanism to separate the plurality of structural solder strips connected together according to the images of the plurality of structural solder strips connected together.

With the foregoing technical solution, the image sensor and the cutting mechanism are respectively communicated with the controller, such that the controller can receive the images of the plurality of structural solder strips connected together collected by the image sensor, and perform image recognition. When the controller identifies the gap between the two adjacent structural solder strips contained in the continuous structural solder strips from the image, the controller controls the cutting mechanism to cut the gap according to the images of the plurality of structural solder strip connected together, so that one structural solder strip is separated from the continuous structural solder strips. It can be seen that the manufacturing device for the interconnection piece provided by the present disclosure can control the cutting mechanism to accurately cut the plurality of structural solder strips connected together with the assistance of the image sensor and the controller, so as to avoid damages to the structural solder strips due to inaccurate cutting, and thus improve a cutting yield.

In a probable implementation, the manufacturing device for the interconnection piece above further includes: a second industrial robot and a speed transducer respectively communicated with the controller. The second industrial robot is configured for intermittently feeding the structural solder strips to the flexible insulating substrate. The speed sensor is configured for collecting a feeding speed of the flexible insulating substrate. The controller is further configured for controlling a time interval for the second industrial robot to put the structural solder strips according to the feeding speed of the flexible insulating substrate and a distribution interval of the structural solder strips in the flexible insulating substrate.

With the foregoing technical solution, the speed sensor and the second industrial robot are respectively communicated with the controller, so that the controller can receive the feeding speed of the flexible insulating substrate collected by the speed sensor, control the time interval for the second industrial robot to put the structural solder strips, and then improve a composite automation degree of the structural solder strips on the flexible insulating substrate.

In a probable implementation, the solder strip unwinding apparatus comprises a first unwinding roller and a conveying roller, and the conveying roller is located between the first unwinding roller and the stamping forming apparatus.

With the foregoing technical solution, as the conveying roller is located between the first unwinding roller and the stamping forming apparatus, the conveying roller can continuously convey the solder strips released by the first unwinding roller, thereby realizing continuous stamping of the structural solder strips, and making mass production of the interconnection piece possible. Meanwhile, because the structural solder strips are distributed on the flexible insulating substrate at intervals, the manufactured interconnection piece can be packaged and stored in the form of coils. Therefore, automatic packaging of the interconnection piece can be partially realized by winding the interconnection piece by using the winding apparatus.

In a probable implementation, the substrate unwinding apparatus includes at least one second unwinding roller.

When a quantity of the second unwinding rollers is one, a surface of the structural solder strip away from the flexible insulating substrate is exposed.

When the quantity of the second unwinding rollers is two, the plurality of structural solder strips may be placed between the first insulating substrate and the second flexible insulating substrate, so that the connecting portions of the plurality of structural solder strips can be wrapped by the two flexible insulating substrates.

The above description is merely a summary of the technical solutions of the present disclosure. In order to more clearly know the technical means of the present disclosure to enable the implementation according to the contents of the description, and in order to make the above and other objects, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the prior art, the drawings that are required to describe the embodiments or the prior art will be briefly introduced below. Apparently, the drawings that are described below are embodiments of the present disclosure, and a person skilled in the art can obtain other drawings according to these drawings without paying creative work.

The accompanying drawings illustrated here serve to provide a further understanding of the present disclosure and constitute a part of the present disclosure, and the illustrative embodiments of the present disclosure and together with the description thereof serve to explain the present disclosure, and do not constitute inappropriate definition to the present disclosure. In the drawings:

FIG. 3A to FIG. 5A are three distribution schematic diagrams of a plurality of rows of through holes distributed along a first direction in the embodiments of the present disclosure;

FIG. 3B to FIG. 5B are three distribution schematic diagrams of a plurality of rows of through holes distributed along a second direction in the embodiments of the present disclosure;

FIG. 14A to FIG. 16A are three distribution schematic diagrams of a plurality of rows of hole forming portions distributed along the first direction in the embodiments of the present disclosure;

FIG. 14B to FIG. 16B are three distribution schematic diagrams of a plurality of rows of hole forming portions distributed along a second direction in the embodiments of the present disclosure.

DETAILED DESCRIPTION OF THE EMBODIMENTS

Figure 1A:
FIG. 1A to FIG. 1C are schematic diagrams showing states of a manufacturing method for an interconnection piece provided by embodiments of the present disclosure at various stages.

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

To make the technical problems to be solved, the technical solutions, and beneficial effects of the present disclosure clearer, the following further describes some embodiments of the present disclosure in detail with reference to the accompanying drawings and embodiments. It should be understood that the specific embodiments described herein are merely illustrative of the present disclosure and are not intended to limit the present disclosure.

It should be noted that when an element is called to be "fixed on" or "arranged on" another element, it may be directly arranged on another element or indirectly arranged on another element. When an element is called to be "connected" to another element, it may be directly connected to another element or indirectly connected to another element.

Moreover, the terms "first" and "second" are only used for descriptive purposes, but cannot be understood as indicating or implying relative importance, or implicitly indicating the number of indicated technical features. Therefore, the features defined with "first" and "second" can explicitly or implicitly include one or more of the features. In the description of the present disclosure, the meaning of "a plurality of" is two or more than two, unless otherwise specifically defined. The meaning of "several" is one or more, unless otherwise specifically defined.

In the description of the present disclosure, it should be understood that the orientation or position relationship indicated by such terms as "upper", "lower", "front", "rear", "left", "right", or the like, is based on the orientation or position relationship shown in the drawings, which is only used for convenience of description of the present disclosure and simplification of description instead of indicating or implying that the indicated device or element must have a specific orientation, and be constructed and operated in a specific orientation, and thus shall not be understood as a limitation to the present disclosure.

In the description of the present disclosure, it should be noted that unless expressly stipulated and defined otherwise, terms such as "installation", "connected" and "connection", or the like, should be understood broadly, for example, the connection may be fixed connection, or detachable connection or integral connection; may be mechanical connection, and may also be electrical connection; and may be direct connection, may also be indirect connection through an intermediate medium, and may also be internal communication of two elements or interaction relationship of two elements. The specific meaning of the above terms in the present disclosure may be understood in a specific case by those having ordinary skills in the art.

The embodiments of the present disclosure provide a manufacturing method for an interconnection piece, and the interconnection piece manufactured by the method may be applied to the interconnection of back-contact cell pieces, but is not limited to this. A category of the back-contact cell piece may be a category of a cell piece 100, which may be an interdigitated back contact (IBC cell), a metallization wrap-through (MWT) silicon solar cell, an emitter-wrap-through (EWT) silicon solar cell, or the like, but not limited to this.

Figure 1B:
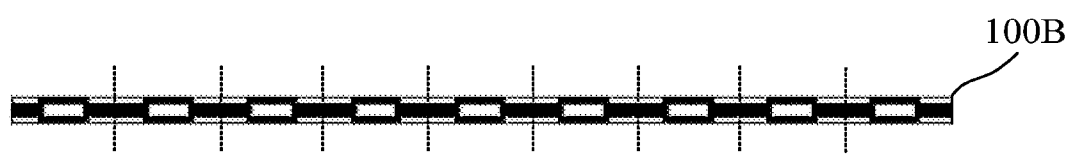
Figure 1C:
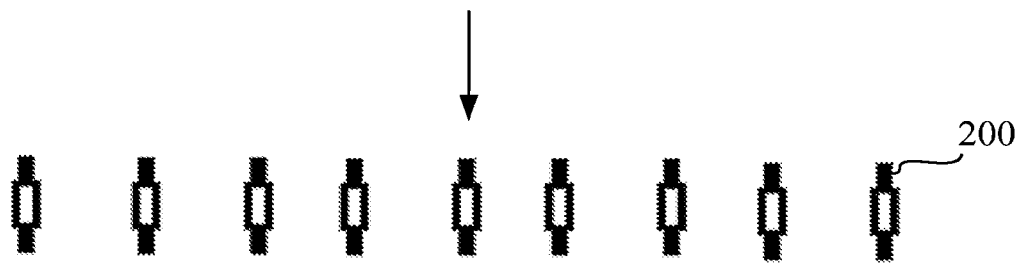
Figure 1C:
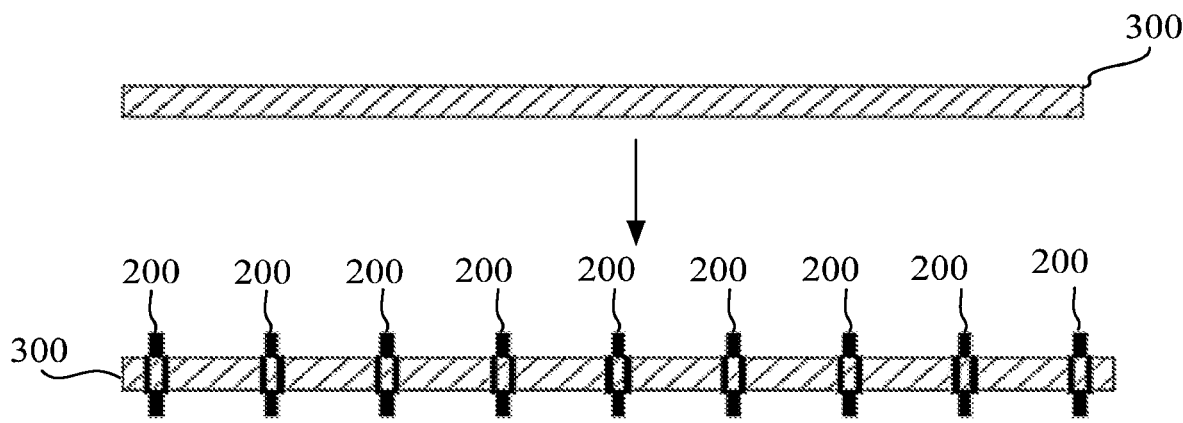

FIG. 1A to FIG. 1C are schematic diagrams showing states of the manufacturing method for the interconnection piece provided by the embodiments of the present disclosure at various stages. As shown in FIG. 1A to FIG. 1C, the manufacturing method for the interconnection piece provided by the embodiments of the present disclosure includes:

As shown in FIG. 1A, a solder strip 100A is provided. In view of flexibility of the solder strip 100A, the solder strip 100A may be unwound by an unwinding roller, a conveying roller and other mechanisms to realize the feeding of the solder strip 100A. The solder strip 100A may have a thickness of 0.02 mm to 0.3 mm and a width of 3 mm to 7 mm. A category of the solder strip 100A may be selected according to the actual situations. For example, the solder strip 100A is made of copper-based materials such as oxygen-free copper or T2 red copper, with a copper content greater than or equal to 99.99 wt % and an electrical conductivity greater than or equal to 98%. The solder strip 100A is a double-sided coating, with a coating material of Sn63Pb37, a coating thickness of 0.02 mm to 0.1 mm, and a melting point of the coating about 183° C. The solder strip 100A has a tensile strength greater than or equal to 150 N/mm2, an elongation at break greater than or equal to 20%, and a yield strength less than or equal to 65 MPa.

The solder strip 100A shown in FIG. 1A is performed forming treatment to obtain a plurality of structural solder strips 200 shown in FIG. 1B. The forming treatment mode is a mechanical stamping mode, a chemical etching mode or a laser cutting mode. For example, as shown in FIG. 1A and FIG. 1B, when the mechanical stamping mode is adopted for performing forming treatment, that the solder strip 100A is performed forming treatment to obtain the plurality of structural solder strips 200 includes: mechanically stamping the solder strip 100A along a length direction of the solder strip 100A to form a plurality of structural solder strips 100B connected together; and separating the plurality of structural solder strips 100B connected together by using a cutting mode.

As shown in FIG. 1C, a flexible insulating substrate 300 is provided. A structure of the flexible insulating substrate 300 is generally a strip structure, such as a rectangular structure, or a structure which is an entirely strip-shaped structure with an irregular outline, such as a wavy flexible insulating substrate. In view of flexibility of the flexible insulating substrate 300, the flexible insulating substrate 300 may be unwound by using an unwinding roller, a conveying roller and other mechanisms to realize the feeding of the flexible insulating substrate 300.

As shown in FIG. 1C, the plurality of structural solder strips 200 are compounded on the flexible insulating substrate 300 at intervals to obtain the interconnection piece. The compounding mode may be a bonding mode or a hot pressing mode, such that the structural solder strip 200 and the flexible insulating substrate 300 form an integrated interconnection piece.

When the compounding mode is the bonding mode, and when each structural solder strip is bonded on the flexible insulating substrate, a binder may be a synthetic polymer binder, including but not limited to one or more of polyvinyl acetate, polyvinyl acetal, acrylate, polystyrene, epoxy resin, acrylic resin, polyurethane resin, unsaturated polyester, butyl rubber, nitrile rubber, phenolic-polyvinyl acetal and epoxy-polyamide.

When the compounding mode is the hot pressing mode, a temperature of the hot pressing mode only needs to ensure that the flexible insulating material is not damaged. For example, the hot pressing mode is performed at a hot pressing temperature ranging from 50° C. to 120° C., and the hot pressing lasts for 5 seconds to 30 seconds. For example, the hot pressing temperature is 50° C.; and the hot pressing time is 30 seconds. For another example, the hot pressing temperature is 120° C., and the hot pressing time is 5 seconds. For another example, the hot pressing temperature is 75° C., and the hot pressing time is 18 seconds.

Figure 2A:
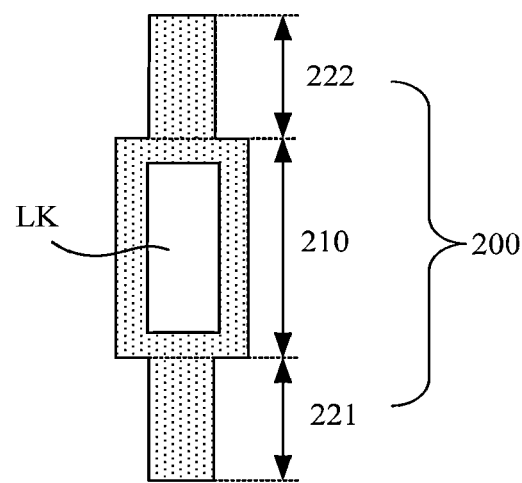
FIG. 2A and FIG. 2B are two schematic structural diagrams of structural solder strips in the embodiments of the present disclosure.
Figure 2B:
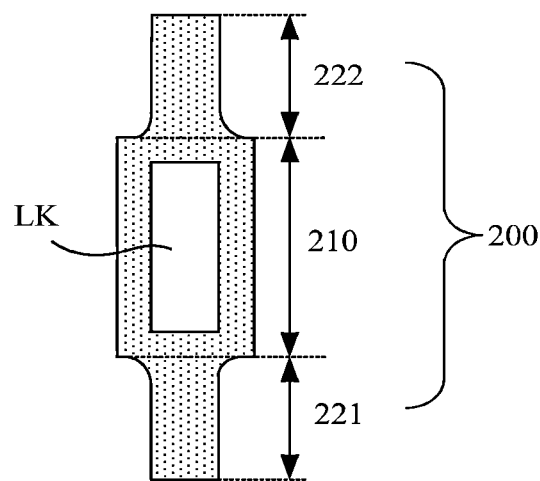

FIG. 2A and FIG. 2B illustrate two schematic structural diagrams of structural solder strips in the embodiments of the present disclosure. As shown in FIG. 2A and FIG. 2B, each structural solder strip 200 is provided with a connecting portion 210 and two soldering portions (hereinafter, referred to as a first soldering portion 221 and a second soldering portion 222). The connecting portion 210 is located between the first soldering portion 221 and the second soldering portion 222, and the connecting portion 210 is respectively connected to the first soldering portion 221 and the second soldering portion 222. At least a part of the connecting portion 210 is located on the flexible insulating substrate 300, and the first soldering portion 221 and the second soldering portion 222 extend out of the flexible insulating substrate 300. For example, a structure of the flexible insulating substrate 300 may be a strip-shaped structure, such that the plurality of structural solder strips 200 are distributed along a strip-shaped extension direction of the flexible insulating substrate 300 at intervals. The first soldering portion 221 and the second soldering portion 222 may both be solid planes, and may extend out of the flexible insulating substrate 300 in opposite directions.

In an example, when each structural solder strip is hot-pressed on the flexible insulating substrate, a thickness of the flexible insulating substrate is as thin as possible. For example, the thickness of the flexible insulating substrate is less than 0.02 mm, so that bending degrees of the first soldering portion 221 and the second soldering portion 222 as shown in FIG. 2A and FIG. 2B can be reduced, so that the first soldering portion 221 and the second soldering portion 222 are soldered in a horizontal manner as much as possible, thereby improving the soldering reliability. Moreover, a thickness of the structural solder strip may be less than or equal to ⅓ of the thickness of the flexible insulating substrate, so as to avoid a problem that the structural solder strip cuts off the flexible insulating substrate due to excessive hot pressing pressure in the hot pressing process. Based on this, the thickness of the solder strip shown in FIG. 1A may be 0.12 mm, and a width of the solder strip is preferably 5 mm.

When the interconnection piece manufactured by the manufacturing method for the interconnection piece provided by the embodiments of the present disclosure is applied to the current conduction of the back-contact cell piece, a quantity of the structural solder strips of the interconnection piece is related to a quantity of pads with the same polarity on the related cell piece that conducts the current. For example, the quantity of the pads of the same polarity of the cell piece is 9, and then the quantity of the structural solder strips 200 arranged on the flexible insulating substrate 300 may be 9, or may be less than 9 or more than 9 certainly, so as to meet the needs of different circuit designs.

During actual application, when the interconnection piece interconnects the cell pieces, one soldering portion of each structural solder strip included in the interconnection piece is soldered with a cathode pad of the cell piece, and the other soldering portion is soldered with an anode pad or a junction bar of another cell piece. The soldering method may be electromagnetic or infrared soldering, but is not limited to this. Moreover, in the process of soldering, laminating or subsequent use, if a thermal stress is generated at the soldering portion, the stress may be transferred to the flexible insulating substrate through the connecting portion and released through the flexible action of the flexible insulating substrate, thus reducing a bending deformation degree of the back-contact cell and improving soldering stability and long-term use stability. For example, when the pad and the interconnection piece are soldered by electromagnetic soldering, the soldering temperature is 180° C. to 380° C. and the soldering time is 1,000 ms to 4,000 ms. For example, the soldering temperature is 180° C., and the soldering time is 4,000 ms. For another example, the soldering temperature is 380° C., and the soldering time is 1,000 ms. another example, the soldering temperature is 250° C., and the soldering time is 2,500 ms.

From the point of view of restraining the deformation of the cell piece, compared with a traditional interconnection solder strip, the plurality of structural solder strips are compounded on the flexible insulating substrate at intervals, which can reduce the amount of solder strip materials, not only reduce the manufacturing cost, but also reduce a contact area between the structural solder strip contained in the interconnection piece and the back of the cell piece, reduce the influence of the thermal stress during interconnection, and improve the reliability of the solar cell assembly. More importantly, when the plurality of structural solder strips may be arranged on the flexible insulating substrate at intervals, the formed interconnection piece has good flexibility. Therefore, the structural solder strip may release the thermal stress generated due to a difference between outdoor high and low temperatures (for example, the soldering process, the laminating process and outdoor environment change), thus reducing the bending deformation degree of the back-contact cell and improving soldering stability and long-term use stability. Meanwhile, when the interconnection piece manufactured by the manufacturing method for the interconnection piece provided by the embodiments of the present disclosure is applied to the interconnection between the back-contact cells, the flexible insulating substrate included in the interconnection piece can provide electrical isolation for areas of two adjacent back-contact cells except the pads, thereby reducing a possibility of electric leakage and improving cell efficiency. That is, the flexible insulating substrate can prevent the structural solder strip from forming a shunt path with an area where the cell piece does not need to be interconnected, thus improving conversion efficiency of the cell.

In an example, as shown in FIG. 2A and FIG. 2B, a width of the first soldering portion 221 and a width of the second soldering portion 222 may both be less than a maximum width of the connecting portion 210. A width direction of the connecting portion and a width direction of the two soldering portions are the same, both of which are a lateral direction in FIG. 2A and FIG. 2B. For example, when the first soldering portion 221, the second soldering portion 222 and the connecting portion 210 are all rectangular structures, sizes of the first soldering portion 221 and the second soldering portion 222 may be 6 mm×1 mm, and a size of the connecting portion 210 may be 6 mm×3 mm. In this case, the width of the first soldering portion 221 and the width of the second soldering portion 222 are both 1 mm, and the width of the connecting portion 210 is 3 mm.

As shown in FIG. 2A and FIG. 2B, the first soldering portion 221 and the second soldering portion 222 are connected to the connecting portion 210 by using a right-angle transition mode or an arc transition mode. When the arc transition mode is adopted for connecting, stress concentration at the arc transition position is not easy to occur, thus further reducing the stress generated by the structural solder strip 200 caused by temperature change (soldering temperature change or external environment temperature change).

In an example, as shown in FIG. 2A and FIG. 2B, the connecting portion 210 included in each structural solder strip 200 is provided with a hollow structure LK for releasing stress. In addition to the hollow structure, other areas of the connecting portion 210 are all solid structures. In this case, the hollow structure LK may be used to release a stress caused by a soldering process, a laminating process and a difference between outdoor high and low temperatures, thereby reducing a bending deformation degree of the back-contact cell and improving soldering stability and long-term use stability.

The hollow structure LK shown in FIG. 2A and FIG. 2B may include at least one through hole. A pattern of each through hole is a closed pattern. In this case, the closed pattern here refers to that an outline pattern of the hollow structure is closed. In this case, an edge outline of the connecting portion 210 is complete, which can ensure that the structural solder strip 200 has good strength. The pattern of each through hole is a polygonal pattern, a circular pattern, an elliptical pattern or a special-shaped pattern. The polygonal pattern may be a triangle, a rectangle, a square, or the like. For example, a shape of the through hole is rectangular, and a length of the through hole may be 1 mm to 10 mm.

FIG. 3A to FIG. 5A illustrate three distribution schematic diagrams of a plurality of rows of through holes distributed along a first direction in the embodiments of the present disclosure. FIG. 3B to FIG. 5B illustrate three distribution schematic diagrams of a plurality of rows of through holes distributed along a second direction in the embodiments of the present disclosure. As shown in FIG. 3A to FIG. 5A and FIG. 3B to FIG. 5B, when the hollow structure LK shown in FIG. 2A and FIG. 2B includes m rows of through holes, m is an integer greater than or equal to 1. Each row of through holes includes at least one through hole. The first row of through holes and the m-th row of through holes are formed in the connecting portion 210 along any direction parallel to the connecting portion 210. For example, when m is an integer greater than or equal to 2, the first row of through holes to the m-th row of through holes are distributed along a distribution direction (first direction A as shown in FIG. 3A to FIG. 5A) of the first soldering portion 221 and the second soldering portion 222. For another example, when m is an integer greater than or equal to 2, the first row of through holes to the m-th row of through holes are distributed along a distribution direction (second direction B as shown in FIG. 3B to FIG. 5B) vertical to the first soldering portion 221 and the second soldering portion 222.

When the first row of through holes to the m-th row of through holes are distributed along the first direction A as shown in FIG. 3A to FIG. 5A, the through holes T are slit-shaped through holes or rectangular through holes, and a distribution mode of two adjacent rows of through holes T may be appropriately adjusted to ensure that there is a shorter circuit path between the first soldering portion 221 and the second soldering portion 222 when ensuring that the strength and stress relieving ability are appropriate.

When the first row of through holes to the m-th row of through holes are distributed along the second direction B as shown in FIG. 3B to FIG. 5B, the through holes T are slit-shaped through holes or rectangular through holes. When a length direction of the through hole T is from the distribution direction vertical to the first soldering portion 221 and the second soldering portion 222, an interval between two rows of through holes may be adjusted, so that currents of the first soldering portion 221 and the second soldering portion 222 can be transmitted to another soldering portion through the connecting portion 210 as linearly as possible, thereby reducing a current loss.

Figure 3A:
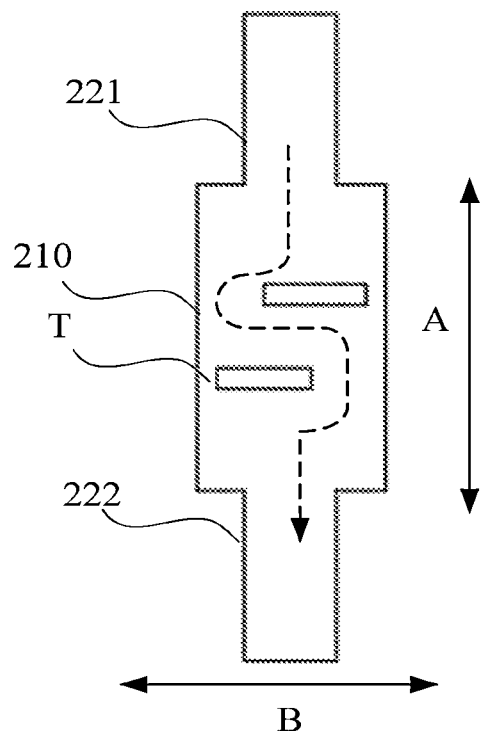
Figure 3B:
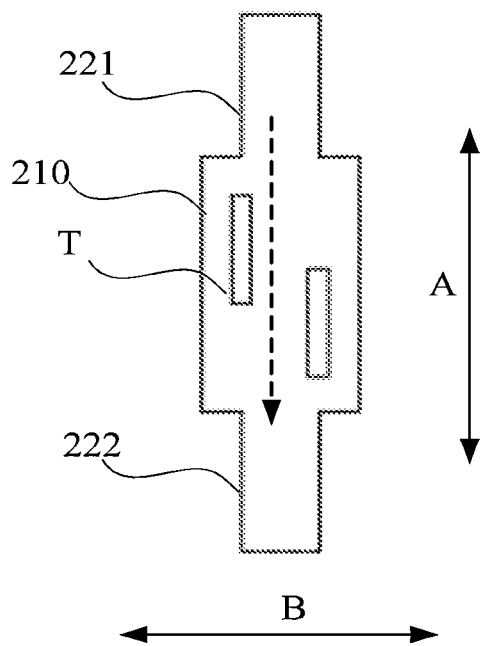

Exemplary, two adjacent rows of through holes are distributed in a staggered way. At this time, the m rows of through holes in the connecting portion can uniformly release the stress generated by the structural solder strips, and further reduce the deformation degree of the back-contact cell. Certainly, the distribution form of each row of through holes may also be adjusted to balance a structural strength and a stress release capacity of the connecting portion. For example, as shown in FIG. 3A and FIG. 3B, the connecting portion 210 contained in the structural solder strip 200 is provided with two rows of slit-type through holes distributed in a staggered way. The two rows of slit-type through holes may either be distributed along the first direction A shown in FIG. 3A, or distributed along the second direction B shown in FIG. 3B.

As shown in FIG. 3A, when two rows of through holes are distributed according to the first direction A shown in FIG. 3A, ends of the first row of through holes and ends of the second row of through holes are staggered, so that a current conducted by the first soldering portion 221 and the second soldering portion 222 can be conducted in the connecting portion 210 along a dotted line direction shown in FIG. 3A.

As shown in FIG. 3B, when two rows of through holes are distributed according to the second direction B shown in FIG. 3B, each row of through holes is a slit-type through hole. A length direction of the slit-type through hole is the same as the first direction A. In this case, a distance between two adjacent rows of slit-type through holes may be adjusted, which enables the first soldering portion 221 and the second soldering portion 222 to conduct the current in a dotted line direction shown in FIG. 3B.

Figure 4A:
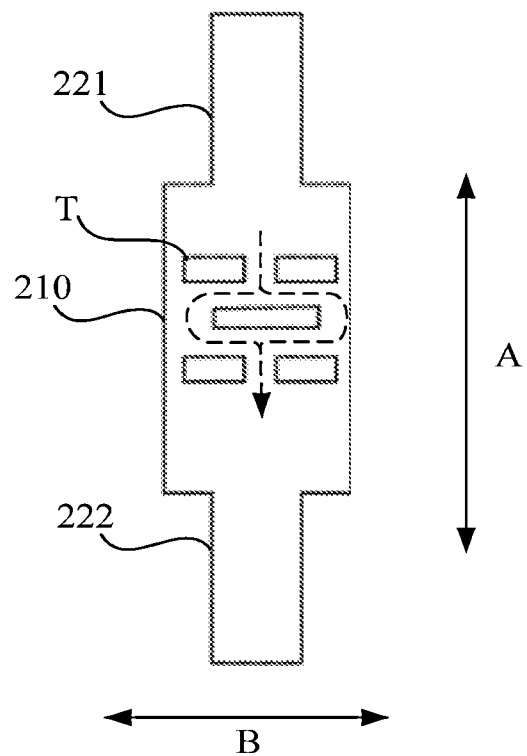
Figure 4B:
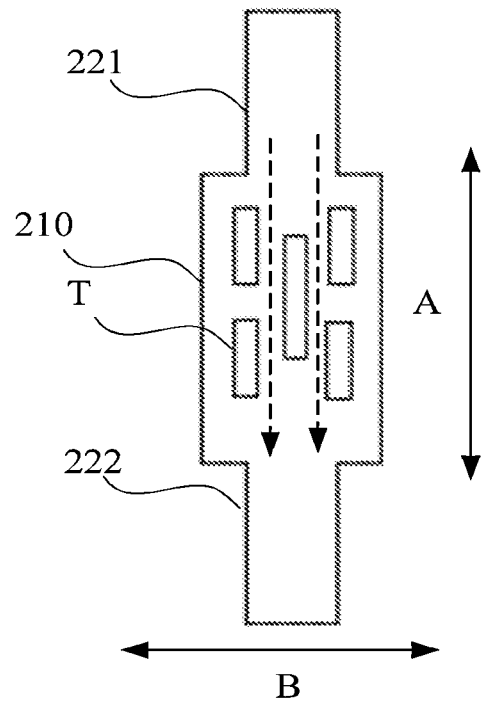

For example, as shown in FIG. 4A and FIG. 4B, m is an integer greater than or equal to 3. The quantity of through holes T contained in the first row of through holes and the quantity of through holes T contained in the m-th row of through holes are both greater than or equal to 2. In this case, along the distribution direction of the first row of through holes to the m-th row of through holes, the quantity of through holes T included in each row of through holes decreases first and then increases. In this case, along the distribution direction of the first row of through holes to the m-th row of through holes, a structural strength of the connecting portion 210 increases first and then decreases, and a stress of the connecting portion 210 sequentially decreases first and then sequentially increases. Based on this, a distribution manner of the through holes T in the connecting portion 210 may be used to adjust strength and a stress release capacity of each area of the connecting portion 210, so that the strength and the stress release capacity of the connecting portion 210 achieve coordination.

As shown in FIG. 4A and FIG. 4B, when the first row of through holes and the m-th row of through holes are formed in the connecting portion 210 along the distribution direction of the two soldering portions, if the quantity of through holes T contained in each row of through holes decreases first and then increases, and a distance between the front and rear ends of each row of through holes and an edge of the connecting portion 210 decreases first and then increases, a current path of the connecting portion 210 of the current conducted between the first soldering portion 221 and the second soldering portion 222 is as short as possible.

For example, as shown in FIG. 4A and FIG. 4B, the connecting portion 210 contained in the structural solder strip 200 is provided with three rows of slit-type through holes. The first row of through holes and the third row of through holes both include two slit-type through holes, and the second row of through holes includes one slit-type through hole. One slit-type through hole included in the second row of through holes is longer than the slit-type through hole included in the first row of through holes, but does not exceed ends of the first row of through holes and the third row of through holes. In this case, the first row of through holes and the third row of through holes contain a large quantity of slit-type through holes while the second row of through holes contain a small quantity of slit-type through holes, which can make the strain relief ability of both ends of the connecting portion 210 higher, but the strength is weaker, and the strain relief ability of a middle position is poor, but the strength is higher. Therefore, the distribution manner of the m rows of through holes can balance the strain relief ability and strength of each area of the connecting portion 210, so that the structural solder strip 200 has high strain relief ability while ensuring the strength.

As shown in FIG. 4A, when three rows of through holes are distributed according to the first direction A shown in FIG. 4A, ends of the second row of through holes do not exceed ends of the first row of through holes and the third row of through holes, so that the current conducted by the first soldering portion 221 and the second soldering portion 222 is conducted in a current path of the connecting portion 210 in a dotted line shown in FIG. 4A.

As shown in FIG. 4B, when the three rows of through holes are distributed along the second direction B shown in FIG. 4B, each row of through holes is a slit-type through hole, and a length direction of the slit-type through hole is distributed along the first direction. In this case, a distance between two adjacent rows of slit-type through holes may be adjusted, and the current path of the current conducted by the first soldering portion 221 and the second soldering portion 222 in the connecting portion 210 is the dotted line shown in FIG. 4B.

Figure 5A:
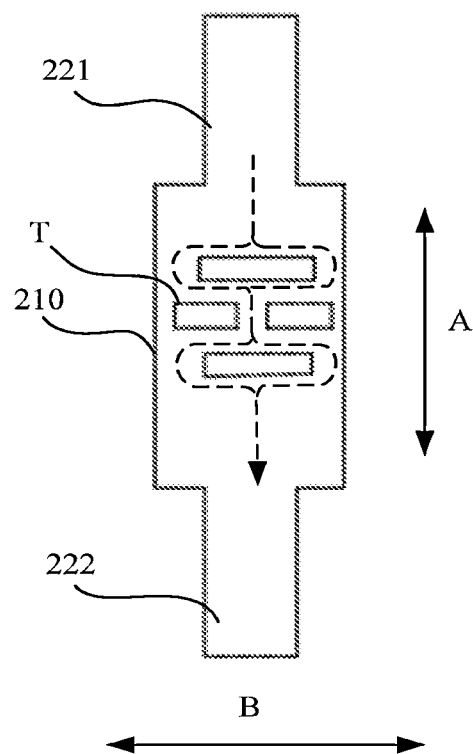
Figure 5B:
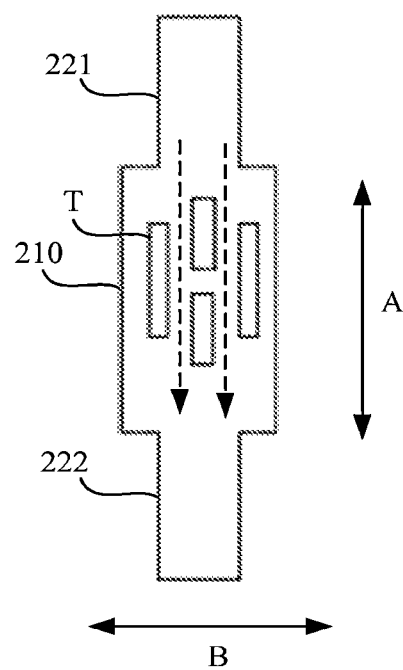

Illustratively, as shown in FIG. 5A and FIG. 5B, when m is an integer greater than or equal to 3, a quantity of through holes contained in the first row of through holes and a quantity of through holes contained in the m-th row of through holes are both greater than or equal to 1. Along the distribution direction of the first row of through holes to the m-th row of through holes, the quantity of through holes included in each row of through holes increases first and then decreases.

As shown in FIG. 5A and FIG. 5B, along the distribution direction of the first row of through holes to the m-th row of through holes, if the length of each row of through holes along the row direction increases first and then decreases, a structural strength of the connecting portion 210 decreases first and then increases, and a stress of the connecting portion 210 sequentially increases first and then sequentially decreases along the distribution direction of the first row of through holes to the m-th row of through holes. Based on this, a distribution manner of the through holes in the connecting portion 210 may be used to adjust a strength and a stress release capacity of each area of the connecting portion 210, so that the strength and the stress release capacity of the connecting portion 210 achieve coordination.

For example, as shown in FIG. 5A and FIG. 5B, the connecting portion 210 contained in the structural solder strip 200 is provided with three rows of slit-type through holes. The first row of through holes and the third row of through holes both include one slit-type through hole, and the second row of through holes includes two slit-type through holes. One slit-type through hole included in the first row of through holes is longer than the slit-type through hole included in the second row of through holes, but ends of the first row of through holes and the third rows of through holes do not exceed ends of the second row of through holes. In this case, the first row of through holes and the third row of through holes contain a small quantity of slit-type through holes while the second row of through holes contain a large quantity of slit-type through holes, which can make the strength of both ends of the connecting portion 210 higher, but the strain relief ability is weaker, and the strain relief ability of a middle position is higher, but the strength is weaker. Therefore, the distribution manner of the m rows of through holes T can balance the strain relief ability and strength of each area of the connecting portion 210, so that the structural solder strip 200 has high strain relief ability while ensuring the strength.

As shown in FIG. 5A, when three rows of through holes are distributed according to the first direction A shown in FIG. 5A, ends of the first row of through holes and the third row of through holes do not exceed the second row of through holes, so that the current conducted by the first soldering portion 221 and the second soldering portion 222 may flow in connecting portion 210 in a dotted line direction shown in FIG. 5A.

As shown in FIG. 5B, when the three rows of through holes are distributed along the second direction B shown in FIG. 5B, each row of through holes is a slit-type through hole, and a length direction of the slit-type through hole is distributed along the first direction A. In this case, a distance between two adjacent rows of slit-type through holes may be adjusted, such that the current conducted by the first soldering portion 221 and the second soldering portion 222 may flow in connecting portion 210 in a dotted line direction shown in FIG. 5B.

From the point of view of electrical isolation, during the soldering process between the interconnection piece and the corresponding polar pad, the flexible insulating substrate 300 may play a role in fixing the plurality of structural solder strips 200 during the soldering process, so as to prevent the relative position deviation between the structural solder strip 200 and the pad during the soldering process, thereby improving soldering accuracy and avoiding an electrical short circuit when the structural solder strips 200 and the pad are misaligned. Moreover, when the interconnection piece is located in a gap between two adjacent cell pieces or on one side of a cell piece, the flexible insulating substrate 300 may be partially or completely located in the gap or on one side of the cell piece. If the flexible insulating substrate 300 is partially located in the gap or on one side of the cell piece, the area of the flexible insulating substrate 300 that is not located in the gap or on one side of the cell piece may be attached to an edge of the cell piece.

Figure 6:
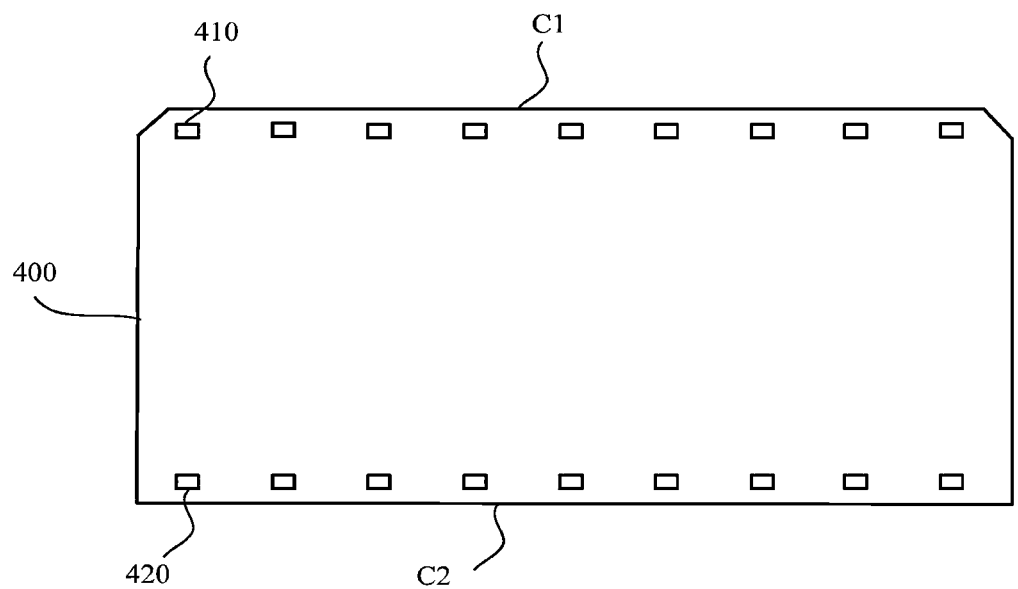
FIG. 6 is a schematic structural diagram of a back of a cell piece applicable to an interconnection piece manufactured in the embodiments of the present disclosure.

FIG. 6 illustrates a schematic structural diagram of a back of a cell piece applicable to an interconnection piece manufactured in the embodiments of the present disclosure. As shown in FIG. 6, a back of the cell piece 400 is provided with 9 cathode pads 410 and 9 anode pads 420. In this case, as shown in FIG. 1A to FIG. 1C, FIG. 2A and FIG. 2B, 9 structural solder strips 200 are distributed on the flexible insulating substrate 300 included in the interconnection piece manufactured by the embodiments of the present disclosure at intervals. The 9 cathode pads 410 are distributed on a first side edge C1 of the cell piece 400, and the nine anode pads 420 are distributed on a second side edge C2 of the cell piece 400. The first side edge C1 and the second side edge C2 are in two opposite directions. For example, when the cell piece 400 is rectangular, the first side edge C1 is close to one long side of the rectangular cell piece, and the second side edge C2 is close to the other long side of the rectangular cell piece. For the convenience of the following description, the two soldering portions of the structural solder strip 200 are respectively defined as the first soldering portion 221 and the second soldering portion 222.

Figure 7A:
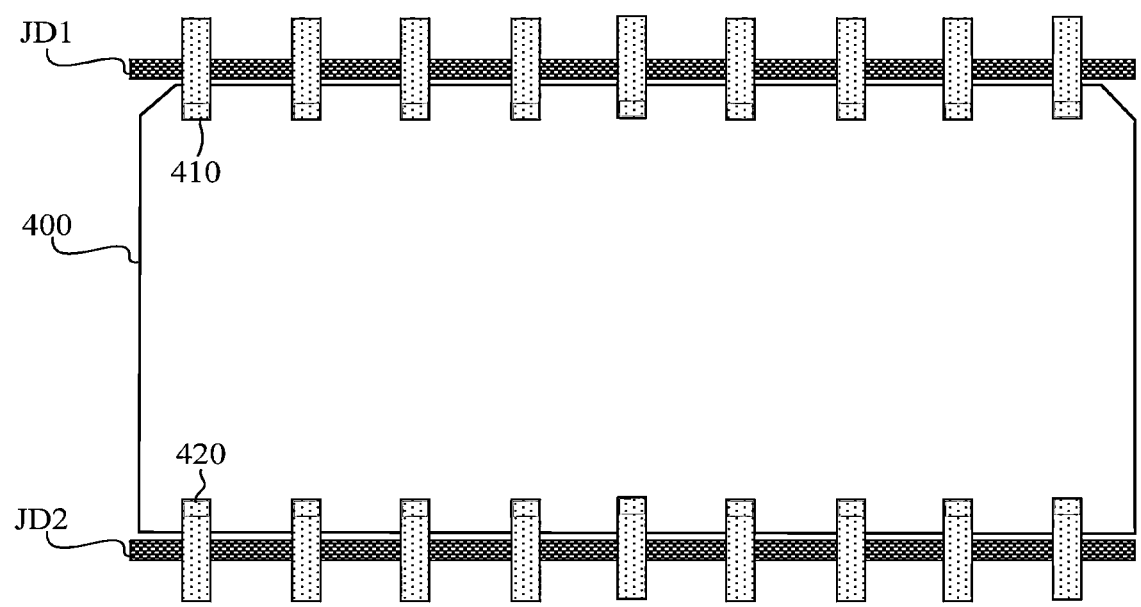
FIG. 7A to FIG. 7C are schematic diagrams of three application scenes of interconnecting the cell piece shown in FIG. 6 by the interconnection piece manufactured in the embodiments of the present disclosure.
Figure 7B:
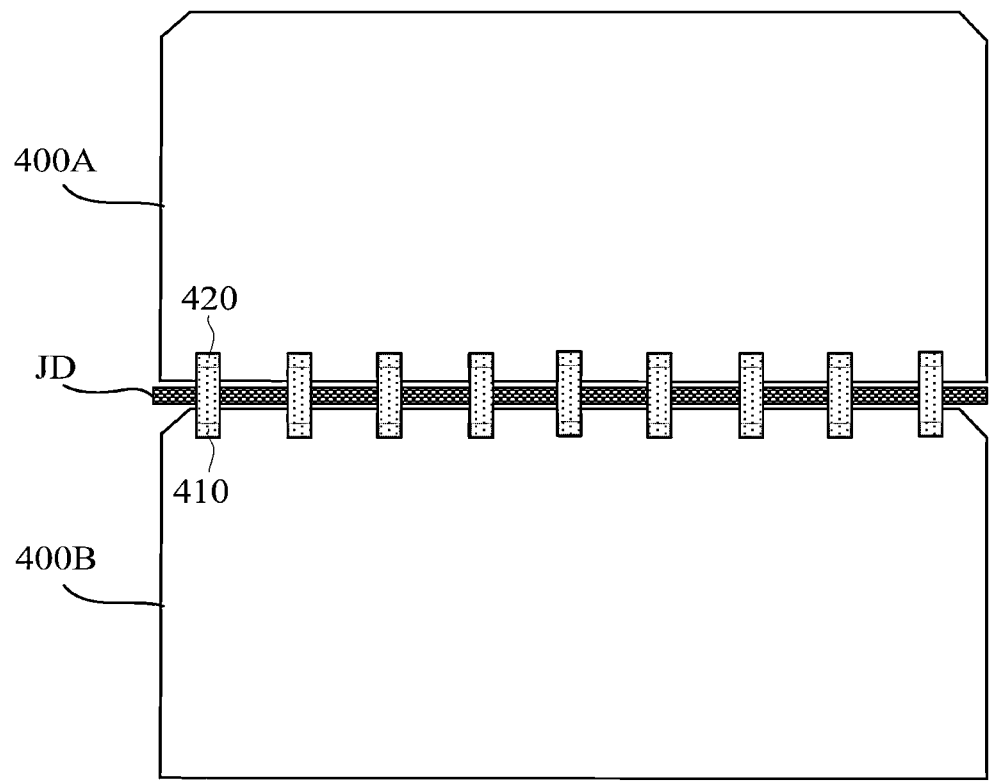
Figure 7C:
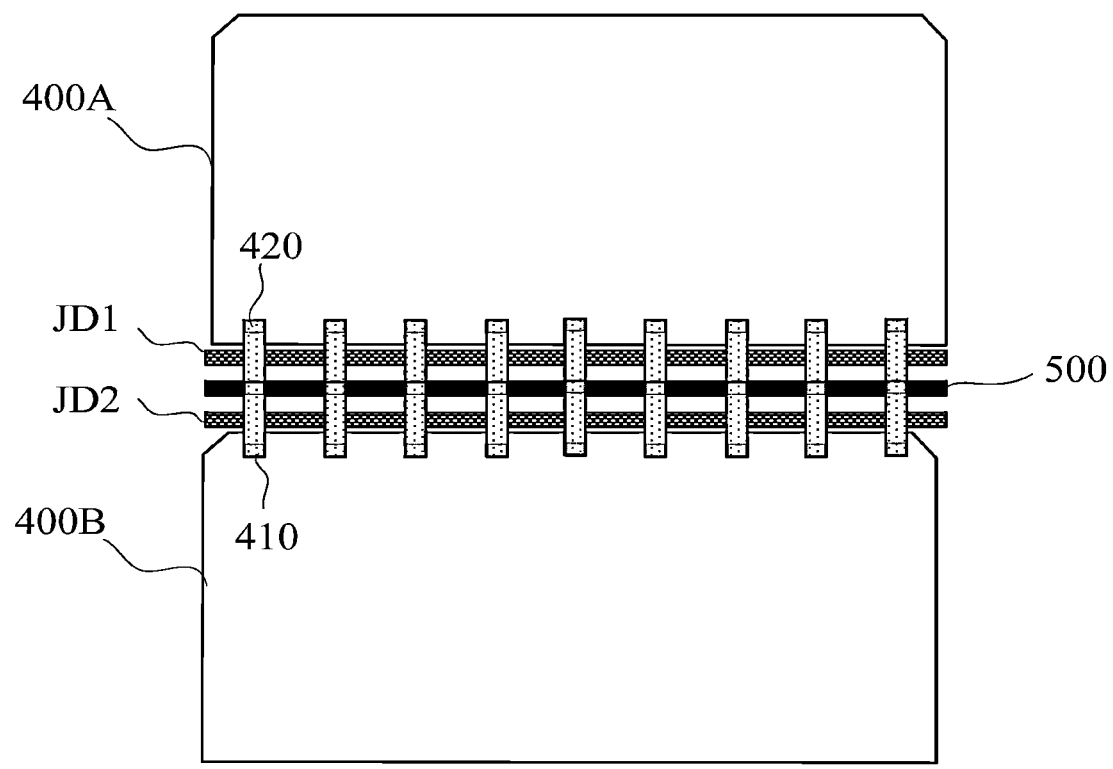

FIG. 7A to FIG. 7C illustrate schematic diagrams of three application scenes of interconnecting the cell piece shown in FIG. 6 by the interconnection piece manufactured in the embodiments of the present disclosure.

As shown in FIG. 7A, both the first side edge C1 and the second side edge C2 of the cell piece 400 are provided with an interconnection piece, which are a first interconnection piece JD1 close to the first side edge C1 and a second interconnection piece JD2 close to the second side edge C2, respectively. The first soldering portions 221 of each structural solder strip 200 included in the first interconnection piece JD1 are soldered to each cathode pad 410 of the cell piece 400 in one-to-one correspondence, and the second soldering portions 222 of each structural solder strip 200 included in the second interconnection piece JD2 are soldered to each anode electrode pad 420 in one-to-one correspondence.

In an example, as shown in FIG. 7B, for a first cell piece 400A and a second cell piece 400B which are adjacent, 9 anode pads 420 of the first cell piece 400A and 9 cathode pads 410 of the second cell piece 400B are all close to the same gap. The gap is internally provided with one interconnection piece JD. As shown in FIG. 1A to FIG. 1C, FIG. 2A and FIG. 2B, the first soldering portions 221 of each structural solder strip 200 included in the interconnection piece JD are soldered to each anode pad 420 of the first cell piece 400A, and the second soldering portions 222 of each structural solder strip 200 included in the interconnection piece are soldered to each cathode pad 410 of the second cell piece 400B. In this case, the first cell piece 400A and the second cell piece 400B may be interconnected by using one interconnection piece.

In another example, as shown in FIG. 7C, for a first cell piece 400A and a second cell piece 400B which are adjacent, 9 anode pads 420 of the first cell piece 400A and 9 cathode pads 410 of the second cell piece 400B are all close to the same gap. The gap is internally provided with a first interconnection piece JD1, a second interconnection piece JD2 and a junction bar 500. As shown in FIG. 1A to FIG. 1C, FIG. 2A and FIG. 2B, the first soldering portions 221 of each structural solder strip 200 included in the first interconnection piece JD1 are soldered to each anode pad 420 of the first cell piece 400A, and the second soldering portions 222 of each structural solder strip 200 included in the first interconnection piece JD1 are soldered to the junction bar 500. The first soldering portions 221 of each structural solder strip 200 included in the second interconnection piece JD2 are soldered with the junction bar 500. The second soldering portions 222 of each structural solder strip 200 included in the second interconnection piece JD2 are soldered with each anode pad 420 of the first cell piece 400A. The second soldering portions 222 of each structural solder strip 200 included in the first interconnection piece JD1 and the first soldering portions 221 of each structural solder strip 200 included in the second interconnection piece JD2 are soldered at the same position as possible on the junction bar 500, so as to reduce a possibility of current transverse conduction (along the strip-shaped extension direction of the flexible insulating substrate 300).

In practical application, as shown in FIG. 7C, the junction bar 500 may be soldered together with the second soldering portions 222 of each structural solder strip 200 included in the first interconnection piece JD1, and then the first soldering portions 221 of each structural solder strip 200 included in the first interconnection piece JD1 are soldered together with the anode pads 420 of the first cell piece 400A. The first soldering portions 221 of each structural solder strip 200 included in the first interconnection piece JD1 may be soldered to the cathode pad 410 of the first cell piece 400A, and then the junction bar 500 may be soldered to the second soldering portions 222 of each structural solder strip 200 included in the first interconnection piece JD1.

As shown in FIG. 7A to FIG. 7C, in the interconnection piece manufactured by the manufacturing method for the interconnection piece provided by the embodiments of the present disclosure, one of the first soldering portion 221 and the second soldering portion 222 may be used as a current input terminal, and the other soldering portion may be used as a current output terminal. In order to shorten a current conduction path as much as possible, central axes of the two soldering portions of each structural solder strip 200 included in the interconnection piece manufactured by the embodiments of the present disclosure are collinear. In this case, a current flowing from one soldering portion to the other soldering portion may be conducted as nearly as straight as possible. Here, it is defined that when the first soldering portion 221 and the second soldering portion 222 are rectangular, the axes of the first soldering portion 221 and the second soldering portion 222 along length directions of the first soldering portion 221 and the second soldering portion 222 are the central axes. In this case, a current flowing from the first soldering portion 221 to the second soldering portion 222 may be conducted as nearly as straight as possible.

Figure 8:
FIG. 8 is a schematic structural diagram of a flexible insulating substrate provided by the embodiments of the present disclosure.

FIG. 8 is a schematic structural diagram of a flexible insulating substrate provided by the embodiments of the present disclosure. As shown in FIG. 5, the flexible insulating substrate 300 is internally provided with a conducting layer 320. As shown in FIG. 2A and FIG. 2B, the connecting portions 210 of the structural solder strips 200 are electrically connected through the conducting layer 320. It should be understood that the conducting layer 320 in FIG. 8 is partially exposed, but in actual situation, the exposed conducting layer 320 in FIG. 8 is generally embedded in the flexible insulating substrate 300 to reduce unnecessary pollution and loss.

As shown in FIG. 8, the conducting layer 320 may be a conducting ribbon or a conducting particle layer composed of metal particles in contact with each other. The conducting ribbon may be one or more of a copper ribbon, a silver ribbon, an aluminum ribbon, or the like. The conducting particle layer may include one or more of copper particles, silver particles, aluminum particles, or the like, which are mutually contacted with each other. In practical application, conductive particle slurry may be formed on one side of the flexible insulating layer, and a solvent contained in the flexible insulating substrate 300 may be removed (e.g., dried at low temperature) to form the conducting particle layer without damaging the flexible insulating substrate 300. Then, another flexible insulating substrate 300 is covered on a surface of the flexible insulating layer where the conducting particle layer is formed, so that the conducting particle layer is formed in the flexible insulating substrate 300.

Based on the above structure, the conducting layer electrically connects the connecting portions included in each structural solder strip together, such that the conducting layer may be used as a lateral conducting channel. When the first soldering portion of one structural solder strip of the plurality of structural solder strips has poor soldering with the cathode pad, the structural solder strip is partially failed as a vertical conducting channel, but the structural solder strip may also conduct the current to other well-soldered structural solder strips by using the conducting layer, thus avoiding a problem of cell efficiency reduction when the vertical conducting channel is partially failed, thus improving the connection reliability of the interconnection piece.

Figure 9A:
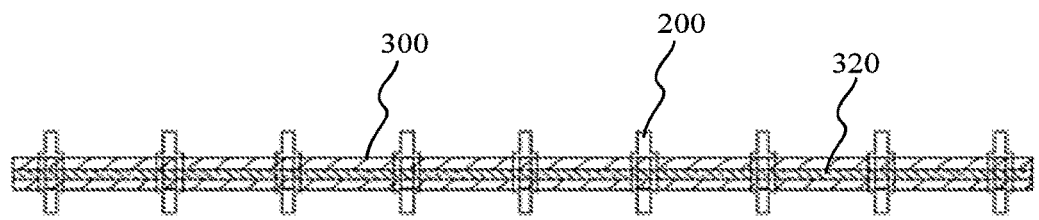
FIG. 9A is a schematic structural diagram of an example interconnection piece in the embodiments of the present disclosure.
Figure 9B:
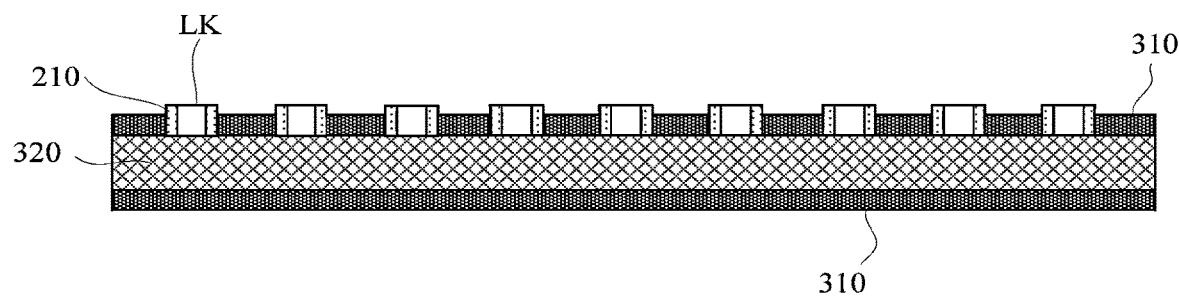
FIG. 9B is a schematic structural diagram of another example interconnection piece in the embodiments of the present disclosure.

FIG. 9A illustrates a schematic structural diagram of an example interconnection piece in the embodiments of the present disclosure. FIG. 9B illustrates a schematic structural diagram of another example interconnection piece in the embodiments of the present disclosure. As shown in FIG. 9A and FIG. 9B, a surface of the connecting portion 210 of each structural solder strip 200 away from the flexible insulating substrate 300 is exposed. In this case, the plurality of structural solder strips 200 may be placed on the surface of the flexible insulating substrate 300, and the plurality of structural solder strips 200 may be pressed on the flexible insulating substrate 300 under pressure.

As shown in FIG. 9A and FIG. 9B, when the flexible insulating substrate 300 is internally provided with the conducting layer 320, the flexible insulating substrate 300 includes two flexible insulating layers 310 and the conducting layer 320 located between the two flexible insulating substrates 310. In this case, when the plurality of structural solder strips 200 are pressed on one side of the flexible insulating substrate 300 by a hot pressing process, the pressure can be controlled, so that a bottom of the connecting portion 210 contained in the structural solder strip 200 contacts with the conducting layer 320.

Figure 10A:
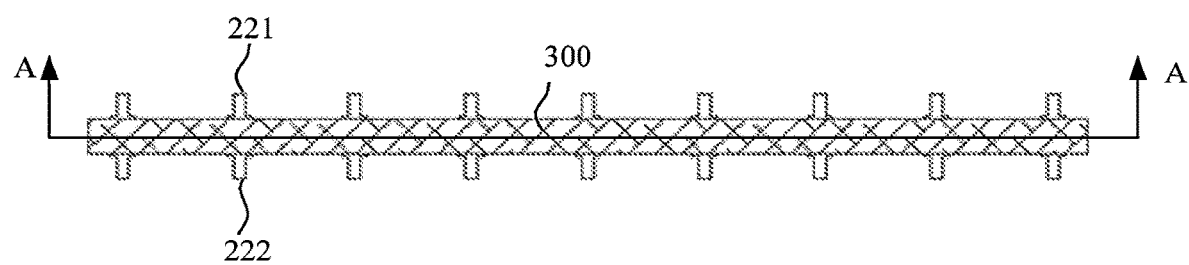
FIG. 10A is a schematic structural diagram of yet another example interconnection piece in the embodiments of the present disclosure.
Figure 10B:
FIG. 10B is a sectional view of the interconnection piece shown in FIG. 10A in an A-A direction.

FIG. 10A illustrates a schematic structural diagram of another example interconnection piece in the embodiments of the present disclosure. FIG. 10B illustrates a sectional view of the interconnection piece shown in FIG. 10A in an A-A direction. As shown in FIG. 10A and FIG. 10B, the connecting portion 210 of each structural solder strip 200 is embedded in the flexible insulating substrate 300. At least a part of the connecting portion 210 of each structural solder strip 200 is wrapped in the flexible insulating substrate 300. The first soldering portion 221 and the second soldering portion 222 extend out of the flexible insulating substrate 300 in two opposite directions. In this case, the interconnection piece shown in FIG. 10A is a sandwich structure, and the flexible insulating substrate 300 may be used to further fix the structural solder strip 200, which not only further reduces or eliminates possible displacement of the structural solder strip 200 in the soldering process, but also eliminates a possibility of connection failure between the structural solder strip 200 and the flexible insulating substrate 300 when one soldering portion of the structural solder strip 200 is stressed and warped, thus ensuring connection stability between the structural solder strip 200 and the flexible insulating substrate 300.

Figure 10C:
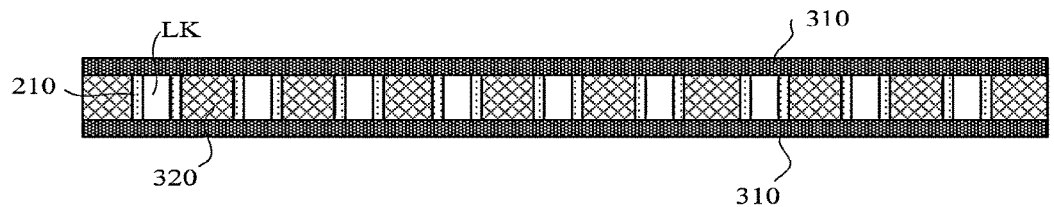
FIG. 10C is another sectional view of the interconnection piece shown in FIG. 10A in the A-A direction.

FIG. 10C illustrates another sectional view of the interconnection piece shown in FIG. 10A in an A-A direction. As shown in FIG. 10C, the flexible insulating substrate includes two flexible insulating layers 310 and the conducting layer 320 located between the two flexible insulating layers 310, such that the conducting layer 320 is embedded in the flexible insulating substrate. When the plurality of structural solder strips are pressed between the two flexible insulating layers 310 by a hot pressing process, the conducting layer 320 may be formed in one flexible insulating layer first, and then the structural solder strip 200 shown in FIG. 2A or FIG. 2B can be formed on a surface of the flexible insulating layer where the conducting layer 320 is formed. Based on this, another flexible insulating layer is pressed on a surface of the flexible insulating layer 310 where the conducting layer 320 is formed. In this case, the connecting portion 210 of each structural solder strip is at least partially wrapped between the two flexible insulating layers 310, thus ensuring that the connecting portion 210 of each structural solder strip 200 directly contacts the conducting layer 320.

From the point of view of the appearance of the solar cell assembly and cell packaging operation, as shown in FIG. 7A to FIG. 7C, when the interconnection piece is located in the gap between two adjacent cell pieces 400 or on one side of the cell piece 400, the flexible insulating substrate 300 may block the gap at the edge of the cell piece 400, and reduce the possibility of particles generated in the soldering process migrating to a front of the cell piece 400 through the edge of the cell piece 400, so as to reduce the pollution of particles to the front of the cell piece 400 during the soldering process, subsequent process or use process. Moreover, the flexible insulating substrate 300 may also be used as an interval mark of the back-contact cell, thus realizing assembly symmetry and aesthetics of the solar cell assembly.

In an example, a material of the flexible insulating substrate included in the interconnection piece may be an insulating polymer material. The insulating polymer material includes polyvinyl butyral (PVB), polyolefin (POE) or ethylene-vinyl acetate copolymer (EVA), and other polymer materials. As shown in FIG. 7B and FIG. 7C, when a gap is disposed between the first cell piece 400A and the second cell piece 400B, and as long as the interconnection piece is accommodated in the gap, if the selected flexible insulating substrate 300 has thermoplasticity, in the laminating process, the flexible insulating substrate 300 may extend to a certain extent in an laminating thermal field environment, so that the flexible insulating substrate 300 may be filled between the first cell piece 400A and the second cell piece 400B, thus completely shielding the gap between the first cell piece 400A and the second cell piece 400B, but the flexible insulating substrate may not extend to the back area of the cell piece to affect power generation of the cell piece.

In an example, the flexible insulating substrate contained in the interconnection piece may be a light-shielding flexible insulating substrate or a transparent flexible insulating substrate. Here, whether the flexible insulating substrate is light-shielding or has color may be realized by adding a light-shielding material or pigment to the insulating polymer material.

If the flexible insulating substrate contained in the interconnection piece is a light-shielding flexible insulating substrate, because the flexible insulating substrate is partially or completely located in the gap between the two adjacent back-contact cells, the flexible insulating substrate can be used as a visual shielding structure, so that the structural solder strip on the back of the solar cell assembly cannot be seen when viewed from the front of the solar cell assembly, thereby improving aesthetics of the solar cell assembly.

When the flexible insulating substrate is a light-shielding flexible insulating substrate, especially a transparent flexible insulating substrate, in order to improve a visual effect, on one hand, the aforementioned visual shielding layer may be attached to a surface of the flexible insulating substrate that needs to face the front of the cell piece to shield the structural solder strip. On the other hand, the flexible insulating substrate may be improved.

The surface of the flexible insulating substrate above is partially or completely provided with a shielding coating. The shielding coating may be located on one side or both sides of the flexible insulating substrate, such that the flexible insulating substrate has an excellent light-shading effect, so as to achieve the object of shielding the interconnection piece and ensure the good appearance of the solar cell assembly. For example, a material of the shielding coating may be a light shielding material, and a color of the shielding coating may be close to or the same as that of the back plate of the solar cell assembly. For example, when a white back plate is used, the color of the shielding coating used is white, and when a black back plate is used, the color of the shielding coating used is black.

In an application scene shown in FIG. 7A to FIG. 7C, when sunlight shines on the interconnection piece, the shielding coating formed by the flexible insulating substrate included in the interconnection piece may scatter the sunlight to the surrounding cell piece, so as to improve a light utilization rate of the cell piece. In addition, a material of the adhesive layer used in the solar cell assembly is a polymeric material which is easy to age and discolor. For example, EVA is easy to turn brown when contacting with Cu or other materials for a long time. The shielding coating can be used to effectively reduce an influence of bonding layer close to back plate discoloring on the appearance of the solar cell assembly.

For another example, the flexible insulating substrate above has a single-sided adhesive tape with a release layer or a double-sided adhesive tape provided with a release layer. In an application scene shown in FIG. 7A to FIG. 7C, the release layer can reduce pollution of an environment or an operating platform to a surface of the adhesive tape during the machining process of the solar cell assembly. A color of the release layer may refer to a color of the aforementioned shielding coating, and an effect of the release layer may also refer to the related description of the aforementioned shielding coating. Meanwhile, at the back of the flexible insulating substrate facing the back (that is, the surface on which the plurality of structural solder strips are formed) of the cell piece, the flexible insulating substrate is located in an area between two adjacent structural solder strips, and a release layer may also be formed to prevent particle pollution (from component machining or subsequent use).

In actual application, as shown in FIG. 7B and FIG. 7C, the adhesive side of the single-sided adhesive tape may be attached to edges of the first cell piece 400A and the second cell piece 400B close to the same gap, so that the adhesive side of the single-sided adhesive tape faces the front of the cell piece, and then the structural solder strip is soldered on the corresponding polar pad. In this case, the single-sided adhesive tape, as the flexible insulating substrate, plays a role in positioning before soldering, so that a position of the structural solder strip is not easy to displace when soldering the structural solder strip. Certainly, for the double-sided adhesive tape, it is only required to attach any side to the edges of the first cell piece 400A and the second cell piece 400B close to the same gap, which will not be elaborated here.

Figure 11:
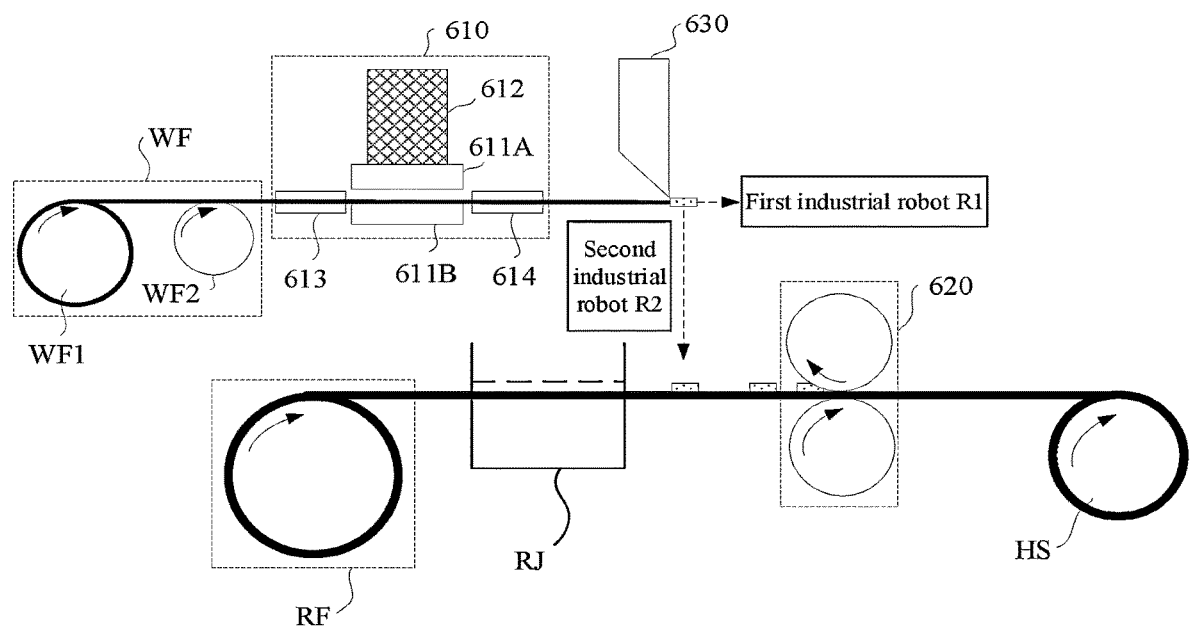
FIG. 11 is a schematic structural diagram of a manufacturing device for an interconnection piece provided by the embodiments of the present disclosure

FIG. 11 illustrates a schematic structural diagram of a manufacturing device for an interconnection piece provided by the embodiments of the present disclosure. As shown in FIG. 11, the manufacturing device for the interconnection piece provided by the embodiments of the present disclosure includes: a solder strip unwinding apparatus WF, a stamping forming apparatus 610, a material compounding apparatus 620 and a winding apparatus HS.

As shown in FIG. 11, the stamping forming apparatus 610 is configured for performing forming treatment on the solder strip 100A shown in FIG. 1A to obtain a plurality of structural solder strips 200 shown in FIG. 1B. The material compounding apparatus 620 is configured for compounding the plurality of structural solder strips 200 shown in FIG. 1B on the flexible insulating substrate 300 shown in FIG. 1C at intervals to obtain the interconnection piece. It should be understood that a specific structure of the solder strip or the flexible insulating substrate 300 shown in FIG. 1C may refer to the previous description of the manufacturing device for the interconnection piece, which will not be elaborated here.

Specifically, in order to realize automatic feeding of the solder strip, as shown in FIG. 11, the above-mentioned solder strip unwinding apparatus WF is configured for providing the solder strip 100A to the stamping forming apparatus 610, so that the solder strip unwinding apparatus WF can supply the solder strip to the stamping forming apparatus 610, thus realizing the automatic feeding of the stamping forming apparatus 610, so that the stamping forming apparatus WF can continuously stamping the solder strip. For example, the solder strip unwinding apparatus WF includes a first unwinding roller WF1 and a conveying roller WF2. The conveying roller WF2 is located between the first unwinding roller WF1 and the stamping forming apparatus 610. In this case, as the conveying roller WF2 is located between the first unwinding roller WF1 and the stamping forming apparatus 610, the conveying roller WF2 can continuously convey the solder strips 100A released by the first unwinding roller WF1, thereby making mass production of the interconnection piece possible.

Figure 12A:
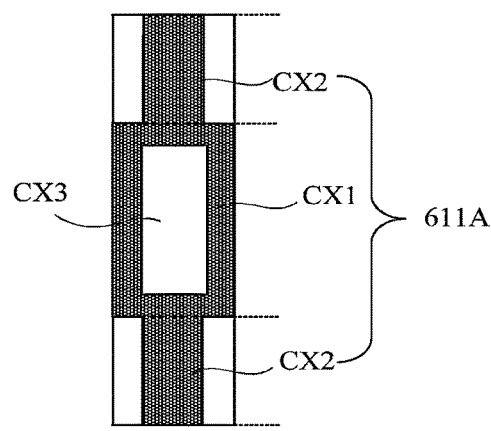
FIG. 12A and FIG. 12B are schematic structural diagrams of a stamping die in the embodiments of the present disclosure.
Figure 12B:
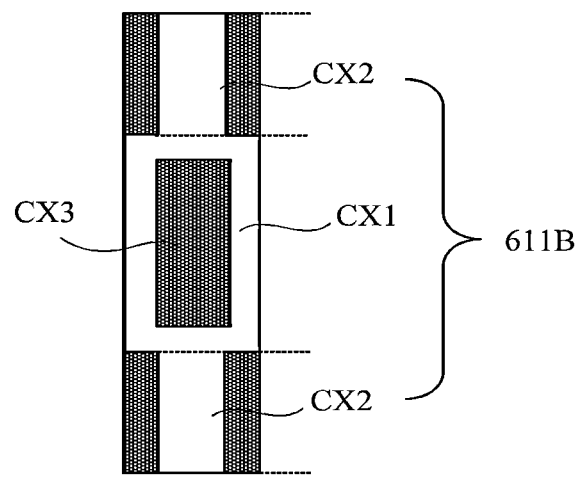
Figure 13A:
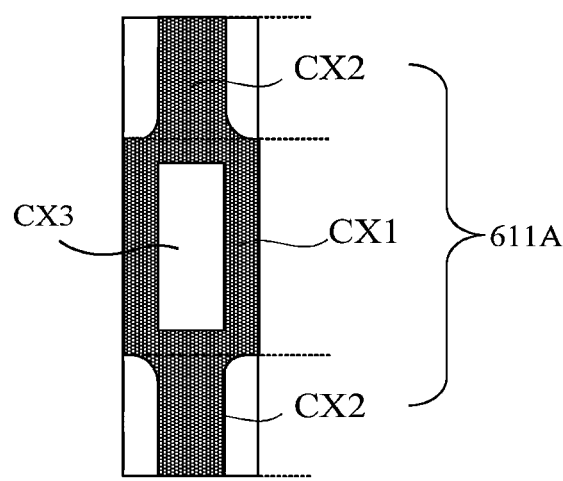
FIG. 13A and FIG. 13B are schematic structural diagrams of another stamping die in the embodiments of the present disclosure.
Figure 13B:
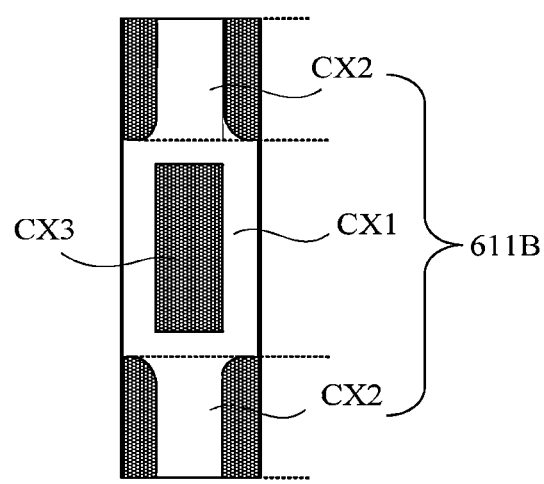

In order to stamping the solder strip into the structural solder strip 200 shown in FIG. 2A or FIG. 2B (which may not contain the hollow structure LK), the stamping forming apparatus 610 shown in FIG. 11 includes a forming die. The forming die includes an upper stamping die 611A and a lower stamping die 611B. FIG. 12A and FIG. 12B illustrate schematic structural diagrams of a stamping die in the embodiments of the present disclosure. FIG. 13A and FIG. 13B illustrate schematic structural diagrams of another stamping die in the embodiments of the present disclosure. As shown in FIG. 12A and FIG. 12B and FIG. 13A and FIG. 13B, the upper stamping die 611A and the lower stamping die 611B are each provided with a first forming portion CX1 for forming a connecting portion 210 shown in FIG. 2A and FIG. 2B and two second forming portions CX2 for forming a soldering portion. The first forming portion CX1 is located between the two second forming portions CX2, and the first forming portion CX1 is respectively connected to the second forming portions CX2. Based on the structure of the upper stamping die 611A and the lower stamping die 611B, when the structural solder strip 200 is stamping-formed by using the stamping forming apparatus 610, each structural solder strip 200 obtained is provided a connecting portion 210 shown in FIG. 2A and FIG. 2B corresponding to the first forming portion CX1, and two soldering portions shown in FIG. 2A and FIG. 2B corresponding to the two second forming portions CX2. The connecting portion 210 shown in FIG. 2A and FIG. 2B is located between the two soldering portions, and the connecting portion 210 shown in FIG. 2A and FIG. 2B is respectively connected to the two soldering portions. In this case, as shown in FIG. 1C, at least a part of the connecting portion 210 shown in FIG. 2A and FIG. 2B of each structural solder strip 200 included in the interconnection piece is located on the flexible insulating substrate 300 shown in FIG. 1C, and the two soldering portions extend out of the flexible insulating substrate 300 shown in FIG. 1C.

It may be understood that as shown in FIG. 12A and FIG. 12B and FIG. 13A and FIG. 13B, the structures of the upper stamping die 611A and the lower stamping die 611B complement each other, so that the upper stamping die 611A and the lower stamping die 611B can stamping the solder strip 100A shown in FIG. 1A into the structural solder strip 200 when the solder strip 100A shown in FIG. 1A is formed. For example, when the first forming portion CX1 and the second forming portion CX2 of the upper stamping die 611A are convex structures or hollow structures, the first forming portion CX1 and the second forming portion CX2 of the lower stamping die 611B are concave structures. The convex structures (or hollow structures) and the concave structures act together on the solder strip 100A shown in FIG. 1A, and then the solder strip 100A shown in FIG. 1A is formed into a structural solder strip 200. In order to simplify the description, for the structural description related to the upper stamping die 611A and the lower stamping die 611B, as long as the description of each forming portion related to the specific structure of the structural solder strip 200 is made, the following description will be made by quoting the previous description, and the implementation and effect thereof will not be repeated.

In an example, as shown in FIG. 12A and FIG. 12B and FIG. 13A and FIG. 13B, central axes of the two second forming portions CX2 are collinear. When the solder strip 100A shown in FIG. 1A is stamped by using the stamping forming apparatus 610, the central axes of the two soldering portions included in the structural solder strip 200 shown in FIG. 2A and FIG. 2B formed are collinear, and the effect thereof is referred to the corresponding description above.

In an example, as shown in FIG. 12A and FIG. and FIG. 13A and FIG. 13B, a width of each second forming portion CX2 is smaller than a width of the first forming portion CX1. Each second forming portion CX2 is connected to the first forming portion CX1 in an arc transition mode. When the solder strip 100A shown in FIG. 1A is stamped by using the stamping forming apparatus 610, the first soldering portion 221 and the second soldering portion 222 contained in the structural solder strip 200 shown in FIG. 2A and FIG. 2B formed are both connected to the connecting portion 210 shown in FIG. 2A and FIG. 2B in an arc transition mode, and the effect thereof is referred to the corresponding description above.

As shown in FIG. 11, in order to realize the automatic feeding of the flexible insulating substrate 300 shown in FIG. 1C, the substrate unwinding apparatus RF above is configured for providing the flexible insulating substrate 300 shown in FIG. 1C to the material compounding apparatus 620. In this case, the plurality of structural solder strips may be compounded on the flexible insulating substrate 300 shown in FIG. 1C at intervals by using the material compounding apparatus 620 to obtain the interconnection piece. When the flexible insulating substrate 300 shown in FIG. 1C is internally provided with a transverse conducting channel, then the conducting layer 320 is embedded in the flexible insulating substrate 300 shown in FIG. 1C.

As shown in FIG. 11, the substrate unwinding apparatus RF includes at least one second unwinding roller. When a quantity of the second unwinding rollers is one, the plurality of structural solder strips 200 shown in FIG. 2A and FIG. 2B are distributed on the flexible insulating substrate 300 shown in FIG. 1C at intervals provided by the second unwinding roller, such that one sides of the plurality of structural solder strips 200 shown in FIG. 2A and FIG. 2B facing the flexible insulating substrate 300 shown in FIG. 1C are tightly combined with the flexible insulating substrate 300 shown in FIG. 1C under the action of the material compounding apparatus 620. In this case, a surface of the structural solder strip 200 shown in FIG. 2A and FIG. 2B away from the flexible insulating substrate 300 shown in FIG. 1C is exposed. If a conducting layer 320 is embedded in the flexible insulating substrate 300 shown in FIG. 8, and a conducting layer 320 is embedded in the flexible insulating substrate 300 shown in FIG. 8 provided by the second unwinding roller, the plurality of structural solder strips 200 shown in FIG. 2A and FIG. 2B are compounded on the flexible insulating substrate 300 shown in FIG. 8 at intervals by using the material compounding apparatus. Furthermore, under the compounding effect, the material compounding apparatus 620 can press the connecting portions 210 included in the plurality of structural solder strips 200 shown in FIG. 2A and FIG. 2B into the flexible insulating substrate 300 shown in FIG. 8, and contact with the conducting layer 320, so that the plurality of structural solder strips 200 shown in FIG. 2A and FIG. 2B are contacted through the conducting layer 320, forming the interconnection piece as shown in FIG. 9A and FIG. 9B.

As shown in FIG. 11, when the quantity of the second unwinding roller is two, the plurality of structural solder strips 200 shown in FIG. 2A and FIG. 2B may be placed between a first insulating substrate and a second flexible insulating substrate, so that the connecting portions 210 of the plurality of structural solder strips 200 shown in FIG. 2A and FIG. 2B can be wrapped by two flexible insulating substrates 300 shown in FIG. 8 (which may be considered as two flexible insulating layers 310). If the conducting layer 320 is embedded in the flexible insulating substrate 300 shown in FIG. 8, the flexible insulating substrates provided by the two second unwinding rollers together form a new flexible insulating substrate. In this case, the conducting layer 320 may be formed between the flexible insulating substrates provided by one or two second unwinding rollers. When the two second unwinding rollers and the plurality of structural solder strips 200 shown in FIG. 2A and FIG. 2B are compounded by the material compounding apparatus 620, the plurality of structural solder strips 200 shown in FIG. 2A and FIG. 2B may be distributed between two flexible insulating substrates at intervals and directly contact with the conducting layer 320 to form an interconnection piece as shown in FIG. 10C.

If the plurality of structural solder strips 200 shown in FIG. 2A and FIG. 2B are bonded to the flexible insulating substrate 300 shown in FIG. 1C in a bonding mode, the flexible insulating substrate 300 shown in FIG. 1C may be dipped, and a binder used in the dipping processing may be a synthetic polymer binder. The polymer binder may refer to the foregoing description. In this case, as shown in FIG. 11, the substrate unwinding apparatus RF further includes: a rubber dip machine RJ. During actual application, each second unwinding roller may be equipped with one set of rubber dip machine RJ for use, such that the flexible insulating substrate 300 shown in FIG. 1C provided by the second unwinding roller may be dipped through the rubber dip machine RJ and then compounded through the material compounding apparatus.

As shown in FIG. 11, the material compounding apparatus 620 may be a hot pressing compounding apparatus, and a hot pressing temperature may be 50° C. to 120° C. The hot pressing compounding apparatus may be a device with pressing action such as a double-roll hot press or a plate-type hot press, and the like.

As shown in FIG. 11, in order to realize automatic packaging, the winding apparatus HS is configured for winding up the interconnection piece, so as to realize continuous stamping of the structural solder strips 200 shown in FIG. 2A and FIG. 2B. Meanwhile, at least a part of the connecting portion of each structural solder strip 200 shown in FIG. 2A and FIG. 2B can be partially located on the flexible insulating substrate 300, so that the obtained interconnection piece has good flexibility. Therefore, the material compounding apparatus 620 can continuously compound the plurality of structural solder strips 200 on the flexible insulating substrate 300 at intervals, and the winding apparatus HS can wind the interconnection pieces, so as to realize rolling packaging of the interconnection pieces.

As shown in FIG. 11, in the manufacturing device for the interconnection piece provided by the embodiments of the present disclosure, the solder strip unwinding apparatus WF may be used to provide the solder strips to the stamping forming apparatus 610 to realize automatic feeding of the stamping forming apparatus 610, so that the stamping forming apparatus 610 can continuously stamp the solder strips.

The upper stamping die 611A and the lower stamping die 611B included in the forming die are each provided with the first forming portion CX1 configured for forming the connecting portion, and the two second forming portions CX2 configured for forming the soldering portion. As the first forming portion CX1 is located between the two second forming portions CX2, the first forming portion CX1 is respectively connected to the two second forming portions CX2. When the stamping forming apparatus 610 is used to perform stamping forming to the solder strip 100A shown in FIG. 1A, the plurality of structural solder strips 200 shown in FIG. 2A and FIG. 2B may be formed. In this case, each structural solder strip 200 shown in FIG. 2A and FIG. 2B includes the connecting portion corresponding to the first forming portion CX1 and the two soldering portions corresponding to the two second forming portions CX2, and the connecting portion is located between the two soldering portions and connected to the two soldering portions.

Based on this, as shown in FIG. 2A, FIG. 2B and FIG. 11, the substrate unwinding apparatus RF may provide the flexible insulating substrate to the material compounding apparatus 620. Therefore, when the stamping forming apparatus 610 may continuously stamping the structural solder strip, the material compounding apparatus 620 can realize automatic feeding of the flexible insulating substrate, such that the material compounding apparatus 620 may be used to continuously compound the plurality of structural solder strips on the flexible insulating substrate at intervals, so as to obtain the interconnection piece. Moreover, at least a part of the connecting portion of each structural solder strip 200 can be partially located on the flexible insulating substrate, so that the obtained interconnection piece has good flexibility. Therefore, the material compounding apparatus 620 can continuously compound the plurality of structural solder strips on the flexible insulating substrate at intervals, and the winding apparatus HS can wind the interconnection pieces, so as to realize rolling packaging of the interconnection pieces. It can be seen that the manufacturing device for the interconnection piece provided by the embodiments of the present disclosure can realize continuous mass production of the interconnection pieces, which is beneficial to the mass production of the interconnection pieces.

As shown in FIG. 11, when the plurality of structural solder strips 200 shown in FIG. 2A and FIG. 2B are arranged on the flexible insulating substrate 300 shown in FIG. 1C at intervals, the amount of solder strip materials can be reduced, which not only reduces the manufacturing cost, but also reduces a contact area between the structural solder strip 200 shown in FIG. 2A and FIG. 2B contained in the interconnection piece and the back of the cell piece, reduces the influence of the thermal stress during interconnection, and improves the reliability of the solar cell assembly. In addition, since the structures of the upper stamping die 611A and the lower stamping die 611B included in the forming die correspond to the structures of the structural solder strips 200 shown in FIG. 2A and FIG. 2B one by one, after the formed plurality of structural solder strips 200 are formed on the flexible insulating substrate 300 shown in FIG. 1C at intervals, the obtained interconnection piece has the beneficial effects of the interconnection piece manufactured by the aforementioned manufacturing method for the interconnection piece, which will not be elaborated here.

In an optional way, in order to further improve a stress releasing function of the interconnection piece manufactured by the manufacturing device for the interconnection piece, as shown in FIG. 11, FIG. 12A, FIG. 13A and FIG. 13B, the upper stamping die 611A and the lower stamping die 611B are each provided with a third forming portion CX3 located in the first forming portion CX1. The third forming portion CX3 is configured for forming a hollow structure LK for releasing stress in the connecting portion 210 shown in FIG. 2A and FIG. 2B. When the solder strip 100A is stamped by using the stamping forming apparatus 610, the connecting portion 210 of the formed structural solder strip 200 shown in FIG. 2A and FIG. 2B has a hollow structure, and the effect thereof is referred to the corresponding description above.

During actual application, as shown in FIG. 11, FIG. 12A, FIG. 13A and FIG. 13B, when the first forming portion CX1 and the second forming portion CX2 are in a convex structure, the third forming portion CX3 is a concave or hollow structure. When the first forming portion CX1 and the second forming portion CX2 are in a concave or hollow structure, the third forming portion CX3 is in a convex structure.

As shown in FIG. 12A, FIG. 13A and FIG. 13B, the third forming portion CX3 includes at least one hole forming portion. A pattern of each hole forming portion is a closed pattern. For example, the pattern of each hole forming portion is a polygonal pattern, a circular pattern, an elliptical pattern or a special-shaped pattern. The effect herein thereof is referred to the description related to the pattern of the hollow structure above.

As shown in FIG. 11, when the solder strip 100A shown in FIG. 1A is stamped by using the stamping forming apparatus 610, the hollow structure contained in the connecting portion 210 of the formed structural solder strip shown in FIG. 2A and FIG. 2B is provided with at least one through hole. The formation of the through hole should correspond to the pattern of the hole forming portion. As for the beneficial effects of the hole forming portion, please refer to the previous description of the through hole, which will not be elaborated here.

In an example, FIG. 14A to FIG. 16A are three distribution schematic diagrams of a plurality of rows of hole forming portions distributed along the first direction in the embodiments of the present disclosure. FIG. 14B to FIG. 16B are three distribution schematic diagrams of a plurality of rows of hole forming portions distributed along a second direction in the embodiments of the present disclosure. It should be appreciated that FIG. 14A to FIG. 16A and FIG. 14B to FIG. 16B all illustrate the distribution manner of the hole forming portion of the upper die, but not illustrate the lower stamping die. However, the structure of the lower stamping die can be undoubtedly derived according to the distribution manner of the hole forming portion of the upper stamping die.

As shown in FIG. 14A to FIG. 16A and FIG. 14B to FIG. 16B, the third forming portion CX3 shown in FIG. 12A and FIG. 13A and FIG. 12B includes m rows of hole forming portions. M is an integer greater than or equal to 1. Each row of hole forming portions includes at least one hole forming portion CK.

As shown in FIG. 14A to FIG. 16A and FIG. 14B to FIG. 16B, when m is an integer greater than or equal to 2, the first row of hole forming portions and the m-th row of hole forming portions are formed in the first forming portion CX1 along any direction parallel to the first forming portion. When the stamping forming apparatus 610 is used to stamp the solder strip 100A, the hollow structure of the formed connecting portion 210 shown in FIG. 2A and FIG. 2B includes m rows of through holes, and each row of through holes include at least one through hole T. For example, when m is an integer greater than or equal to 2, the first row of forming portions to the m-th row of forming portions are distributed along a distribution direction (first direction A as shown in FIG. 14A to FIG. 16A) of the two second forming portions CX2. For another example, the first row of forming portions to the m-th row of forming portions are distributed along a distribution direction (second direction B as shown in FIG. 14B to FIG. 16B) vertical to the two second forming portions CX2.

When the first row of hole forming portions to the m-th row of hole forming portions are distributed along the first direction A as shown in FIG. 14A to FIG. 16A, the hole forming portion CK may be a slit hole forming portion that can form a slit-type through hole or a rectangular hole forming portion that can form a rectangular through hole. A distribution mode of two adjacent rows of hole forming portions may be appropriately adjusted to make the distribution mode of the formed two adjacent rows of through holes show the changes of FIG. 3A to FIG. 5A, so as to ensure that there is a shorter circuit path between the two soldering portions formed by the two second forming portions CX2 when ensuring that the strength and stress relieving ability are appropriate.

When the first row of hole forming portions to the m-th row of hole forming portions are distributed along the second direction B as shown in FIG. 14B to FIG. 16B, the hole forming portion CK may be a slit hole forming portion that can form a slit-type through hole or a rectangular hole forming portion that can form a rectangular through hole. If a length direction of the hole forming portion CK is distributed vertical to the distribution direction of the two second forming portions CX2, a distance between the two rows of hole forming portions can be adjusted, so that when the stamping forming apparatus 610 is used to stamp the solder strip 100A, the distribution manner of the through holes formed by the first row of hole forming portions to the m-th row of hole forming portions is shown in FIG. 3B to FIG. 5B.

Illustratively, when m is an integer greater than or equal to 2, the two adjacent rows of hole forming portions are distributed in a staggered manner. When the stamping forming apparatus 610 is used to stamp the solder strip 100A, the two rows of through holes of the formed connecting portion 210 shown in FIG. 2A and FIG. 2B are distributed in a staggered manner, and the effect thereof is referred to the corresponding description above about the through holes.

Figure 14A:
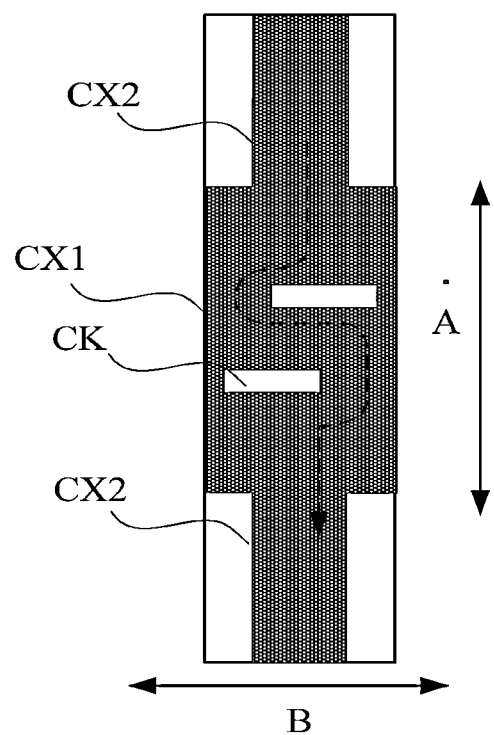
Figure 14B:
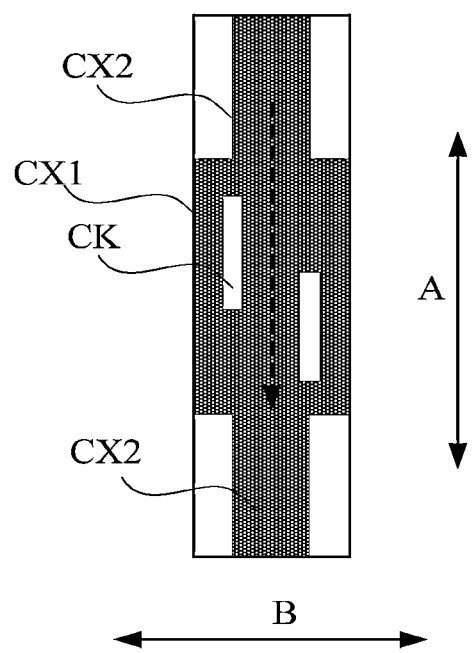

For example, as shown in FIG. 14A and FIG. 14B, the first forming portion CX1 is internally formed with two rows of slit hole forming portions. The two rows of slit hole forming portions may be distributed along the first direction A shown in FIG. 14A, so that the formed through holes are distributed in the manner as shown in FIG. 3A. Certainly, the two rows of slit hole forming portions may also be distributed along the second direction B shown in FIG. 14B, such that when the stamping forming apparatus 610 is used to stamp the solder strip 100A, the distribution mode and effect of the two through holes formed in the two rows of slit hole forming portions are described with reference to FIG. 3B above.

As shown in FIG. 14A, when the two rows of hole forming portions are distributed according to the first direction A shown in FIG. 14A, ends of the first row of hole forming portions and ends of the second row of hole forming portions are staggered, such that when the stamping forming apparatus 610 is used to stamp the solder strip 100A, the distribution mode and effect of the two rows of through holes formed in the first row of hole forming portions and the second row of hole forming portions may be described with reference to FIG. 3A above.

As shown in FIG. 14B, when the two rows of hole forming portions are distributed according to the second direction B shown in FIG. 14B, each row of hole forming portions is a slit hole forming portion. A length direction of the slit hole forming portion is the same as the first direction A shown in FIG. 14B. In this case, a distance between two adjacent rows of slit hole forming portions can be adjusted, such that when the stamping forming apparatus 610 is used to stamp the solder strip 100A, the distribution mode and effect of the two rows of through holes formed at the ends of the first row of hole forming portions and the second row of hole forming portions may be described with reference to FIG. 3B above.

Figure 15A:
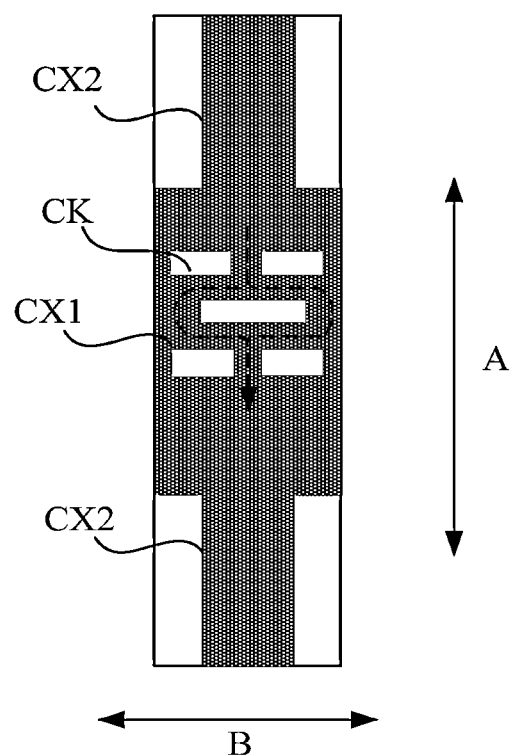
Figure 15B:
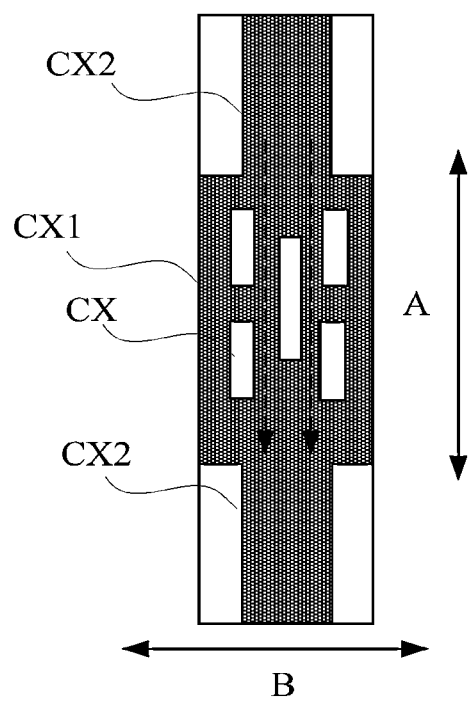

Illustratively, as shown in FIG. 15A and FIG. 15B, m is an integer greater than or equal to 3. A quantity of hole forming portions CK included in the first row of hole forming portions and a quantity of hole forming portions CK included in the m-th row of hole forming portions are both greater than or equal to 2. In this case, along the distribution direction of the first row of hole forming portions to the m-th row of hole forming portions, the quantity of hole forming portions CK included in each row of hole forming portions decreases first and then increases. When the stamping forming apparatus 610 is used to stamp the solder strip 100A, the distribution mode and effect of the m rows of through holes formed by the first row of hole forming portions and the m-th row of hole forming portions may be described with reference to FIG. 4A and FIG. 4B above.

As shown in FIG. 15A and FIG. 15B, when the first row of hole forming portions and the m-th row of hole forming portions are formed in the first forming portion CX1 along the distribution direction of the two second forming portions CX2, along the distribution direction of the first row of hole forming portions to the m-th row of hole forming portions, when a quantity of the hole forming portions CK included in each row of hole forming portions decreases first and then increases, and a distance between the front and rear ends of each row of hole forming portions and an edge of the first forming portion CX1 decreases first and then increases, then when the stamping forming apparatus 610 is used to stamp the solder strip 100A, the distribution mode and effect of the m rows of through holes formed by the first row of hole forming portions and the m-th row of hole forming portions may be described with reference to FIG. 4A and FIG. 4B above.

For example, as shown in FIG. 15A and FIG. 15B, the first forming portion CX1 is internally formed with three rows of slit hole forming portions. The first row of slit hole forming portions and the third row of slit hole forming portions both include two slit hole forming portions, and the second row of slit hole forming portions includes one slit hole forming portion. The length of one slit hole forming portion included in the second row of slit hole forming portions is longer than the length of the slit hole forming portion included in the first row of slit hole forming portions, but does not exceed ends of the first row of slit hole forming portions and the third row of slit hole forming portions. In this case, when the stamping forming apparatus 610 is used to stamp the solder strip 100A, the distribution mode and effect of the three rows of through holes formed at the two rows of slit hole forming portions may be described with reference to FIG. 4A and FIG. 4B above.

As shown in FIG. 15A, when the three rows of slit hole forming portions are distributed according to the first direction A shown in FIG. 15A, the ends of the second row of hole forming portions do not exceed the first row of slit hole forming portions and the slit hole forming portions of the third row of through holes, such that when the stamping forming apparatus 610 is used to stamp the solder strip 100A, the distribution mode and effect of the three rows of through holes formed in the three rows of slit hole forming portions may be described with reference to FIG. 4A above.

As shown in FIG. 15B, when the three rows of slit hole forming portions are distributed according to the second direction B shown in FIG. 15B, the ends of the second row of hole forming portions do not exceed the first row of slit hole forming portions and the third row of slit hole forming portions, such that when the stamping forming apparatus 610 is used to stamp the solder strip 100A, the distribution mode and effect of the three rows of through holes formed in the three rows of slit hole forming portions may be described with reference to FIG. 4B above.

Figure 16A:
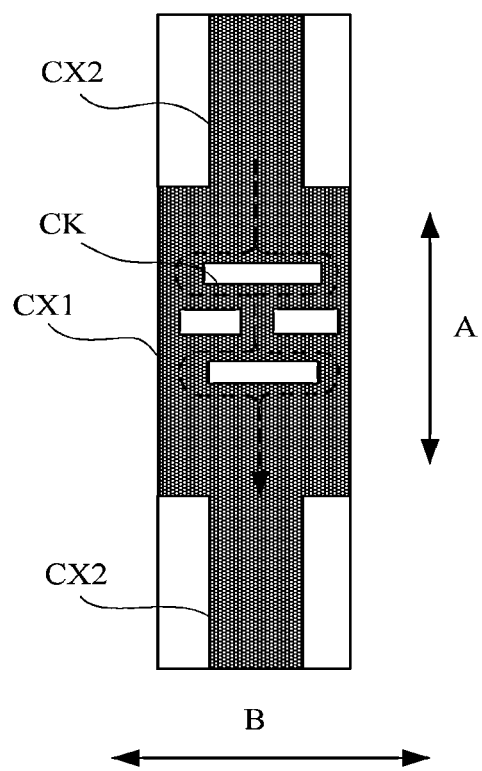
Figure 16B:
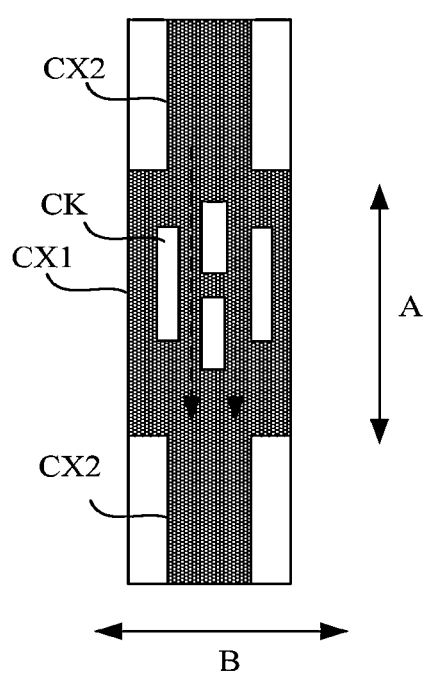

Illustratively, as shown in FIG. 16A and FIG. 16B, when m is an integer greater than or equal to 3, a quantity of hole forming portions contained in the first row of hole forming portions and a quantity of hole forming portions contained in the m-th row of hole forming portions are both greater than or equal to 1. Along the distribution direction of the first row of hole forming portions to the m-th row of hole forming portions, the quantity of hole forming portions CK included in each row of hole forming portions increases first and then decreases. In this case, when the stamping forming apparatus 610 is used to stamp the solder strip 100A, the distribution mode and effect of the m rows of through holes formed by the m rows of hole forming portions may be described with reference to FIG. 5A and FIG. 5B above.

As shown in FIG. 16A and FIG. 16B, along the distribution direction of the first row of hole forming portions to the m-th row of hole forming portions, if the length of each row of hole forming portions along the row direction increases first and then decreases, in this case, when the stamping forming apparatus 610 is used to stamp the solder strip 100A, the distribution mode and effect of the m rows of through holes formed at the m rows of hole forming portions may be described with reference to FIG. 5A and FIG. 5B above.

For example, as shown in FIG. 16A and FIG. 16B, the first forming portion CX1 is internally formed with three rows of slit hole forming portions. The first row of slit hole forming portions and the third row of slit hole forming portions both include one slit hole forming portion, and the second row of slit hole forming portions includes two slit hole forming portions. The length of one slit hole forming portion included in the first row of slit hole forming portions is longer than the length of the slit hole forming portion included in the second row of slit hole forming portions, but ends of the first row of slit hole forming portions and the third rows of slit hole forming portions do not exceed ends of the second row of slit hole forming portions. In this case, a quantity of the slit hole forming portions included in the first row of slit hole forming portions and the third row of slit hole forming portions is relatively small, while a quantity of the slit hole forming portions included in the second row of slit hole forming portions is relatively large. Based on this, when the stamping forming apparatus 610 is used to stamp the solder strip 100A, the distribution mode and effect of the three rows of slit-type through holes formed by the three rows of slit hole forming portions may be described with reference to FIG. 5A and FIG. 5B above.

As shown in FIG. 16A, when the three rows of hole forming portions are distributed according to the first direction A shown in FIG. 16A, the ends of the first row of hole forming portions and the third row of hole forming portions do not exceed the ends of the second row of hole forming portions, such that when the stamping forming apparatus 610 is used to stamp the solder strip 100A, the distribution mode and effect of the three rows of through holes formed by the three rows of hole forming portions may be described with reference to FIG. 5A above.

As shown in FIG. 16B, when the three rows of hole forming portions are distributed along the second direction B shown in FIG. 16B, each row of hole forming portions is a slit hole forming portion, and a length direction of the slit hole forming portion is distributed along the first direction A shown in FIG. 16B. In this case, a distance between two adjacent rows of slit hole forming portions may be adjusted, such that when the stamping forming apparatus 610 is used to stamp the solder strip 100A, the distribution mode and effect of the three rows of through holes formed by the three rows of hole forming portions may be described with reference to FIG. 5B above.

In an optional embodiment, as shown in FIG. 11, the stamping forming apparatus 610 further includes a stamping press 612. The upper stamping die 611A is arranged on the stamping press 612. The stamping press 612 is configured for controlling the upper stamping die 611A and the lower stamping die 611B to perform closing and demoulding. When the stamping press 612 is stamping the solder strip 100A, the stamping press 612 may drive the upper stamping die 611A to approach the lower stamping die 611B until the upper stamping die 611A and the lower stamping die 611B are closed, thus realizing one-step stamping of the solder strip 100A. After one structural solder strip 200 shown in FIG. 2A and FIG. 2B is formed on the solder strip 100A, the stamping press 612 may drive the upper stamping die 611A to move away from the lower stamping die 611B, thereby realizing demoulding of the upper stamping die 611A and the lower stamping die 611B.

To ensure stamping accuracy of the solder strip, as shown in FIG. 11, the stamping forming apparatus 610 further includes a solder strip straightening roller 613 and a solder strip pulling roller 614. The forming die is located between the solder strip straightening roller 613 and the solder strip pulling roller 614. When the stamping press 612 is used to control the upper stamping die 611A to perform demoulding, the solder strip straightening roller 613 is used to correct a position of the solder strip, and the solder strip pulling roller 614 is used to pull the solder strip, so that a part of the solder strip needing to be stamped accurately falls between the upper stamping die 611A and the lower stamping die 611B, thus ensuring that the stamping forming apparatus 610 can normally stamp the solder strip 100A.

In an optional embodiment, as shown in FIG. 11, if the plurality of structural solder strips 200 shown in FIG. 2A and FIG. 2B formed by the stamping of the stamping forming apparatus 610 are connected together, these structural solder strips 200 shown in FIG. 2A and FIG. 2B may be connected together according to a connecting mode shown in FIG. 1B. As shown in FIG. 1B, one soldering portion contained in two adjacent structural solder strips 200 shown in FIG. 2A and FIG. 2B are connected together.

When the plurality of structural solder strips 200 shown in FIG. 2A and FIG. 2B are connected together, as shown in FIG. 11, the manufacturing device for the interconnection piece above further includes: a first industrial robot R1 and a cutting mechanism 630 located between the stamping forming apparatus 610 and the material compounding apparatus 620.

As shown in FIG. 11, the first industrial robot R1 may be a six-degree-of-freedom mechanical arm or the like. The first industrial robot R1 is configured for pulling a plurality of structural solder strips 100B connected together to a cutting station of the cutting mechanism 630 when the upper stamping die 611A and the lower stamping die 611B are demoulded, so that the process of cutting the structural solder strips 200 shown in shown in FIG. 2A and FIG. 2B is automated. Here, the cutting station of the cutting mechanism 630 refers to a position where the plurality of structural solder strips 100 connected together are cut.

As shown in FIG. 11, the cutting mechanism 630 may be a mechanism that can cut the solder strip, such as a solder strip cutter. The cutting mechanism 630 is configured for separating the plurality of structural solder strips 100B connected together at the cutting station of the cutting mechanism 630 to form a plurality of structural solder strips 200 shown in FIG. 2A and FIG. 2B

Figure 17:
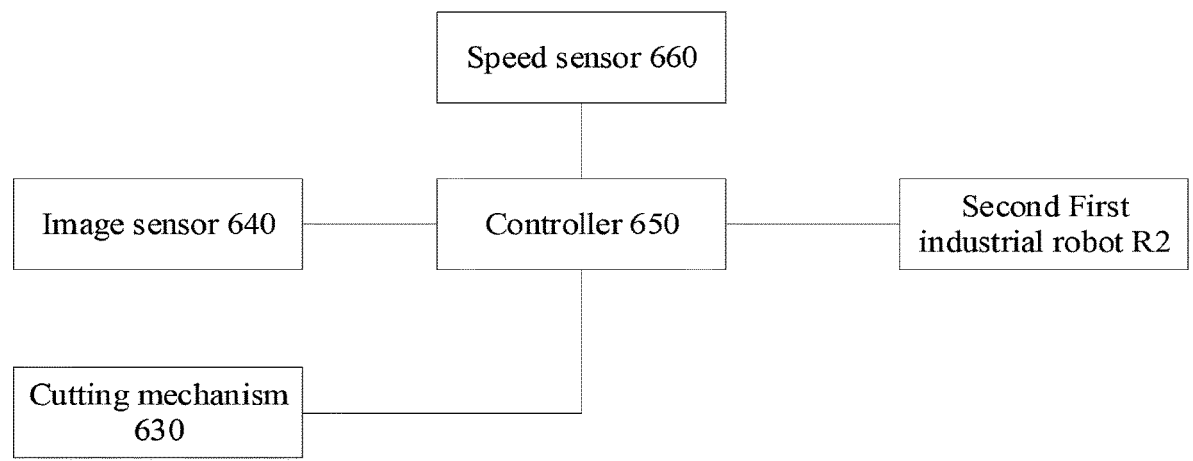
FIG. 17 is an example diagram showing an automation principle of a manufacturing device for an interconnection piece provided by the embodiments of the present disclosure.

In an optional embodiment, FIG. 17 is an example diagram showing an automation principle of a manufacturing device for an interconnection piece provided by the embodiments of the present disclosure. As shown in FIG. 17, the manufacturing device for the interconnection piece further includes: an image sensor 640 and a controller 650 communicated with the image sensor 640 and the cutting mechanism 630. The communication method may be wireless communication or wired communication. The wireless communication may be based on networking technologies such as WiFi and ZigBee. The wired communication can realize communication connection based on data line or power line carrier. A communication interface may be a standard communication interface. The standard communication interface may be a serial interface, and may also be a parallel interface.

As shown in FIG. 17, the image sensor 640 may be a charge coupled device (CCD) camera, and the like, and images collected by the image sensor may be colored images, black and white images, infrared images, and the like. The image sensor 640 may be configured for collecting images of the plurality of structural solder strips 100B connected together at the cutting station of the cutting mechanism 630. The controller 650 is configured for controlling the cutting mechanism 630 to separate the plurality of structural solder strips 100B connected together according to the images of the plurality of structural solder strips 100B connected together.

During actual application, as shown in FIG. 17, the controller 650 is internally integrated with existing image recognition software, such as Cognex image recognition software, intelligent image recognition software, and image recognition software of Haishen Technology, and the like. The image recognition software may generally recognize images based on machine learning manner. For example, firstly, the images of the plurality of structural solder strips 100B connected together at the cutting station of the cutting mechanism 630 are preprocessed, and the preprocessing methods may include edge detection, filtering operation, binarization, image scaling, normalization, and the like. Secondly, feature extraction is carried out on the preprocessed images (for example, extracting the images of the solder strips); and image recognition is performed on the extracted features, and a joint position of two adjacent structural solder strips 200 shown in FIG. 2A and FIG. 2B can be determined according to the recognized images. Based on this, the controller 650 may control a cutter head of the cutting mechanism 630 according to the joint position of the two adjacent structural solder strips 200 shown in FIG. 2A and FIG. 2B, and separate the two adjacent structural solder strips 200 shown in FIG. 2A and FIG. 2B at the joint position of the two adjacent structural solder strips 200 shown in FIG. 2A and FIG. 2B, so that one structural solder strip 200 shown in FIG. 2A and FIG. 2B is separated from the plurality of structural solder strips 100B connected together. It can be seen that the manufacturing device for the interconnection piece provided by the embodiments of the present disclosure can control the cutter head of the cutting mechanism 630 to accurately cut the continuous structural solder strip with the assistance of the image sensor 640 and the controller 650, so as to avoid damages to the structural solder strips 200 shown in FIG. 2A and FIG. 2B due to inaccurate cutting, and thus improve a cutting yield.

As shown in FIG. 17, in order to support the intelligent feeding of the structural solder strip, the manufacturing device for the interconnection piece may further include a second industrial robot R2 and a speed sensor 660 respectively communicated with the controller 650. Here, the controller 650 and the previous controller 650 may be different controllers or the same controller. The communication method may be wireless communication or wired communication. The wireless communication may be based on networking technologies such as wife and zigbee. The wired communication can realize communication connection based on data line or power line carrier. A communication interface may be a standard communication interface. The standard communication interface may be a serial interface, and may also be a parallel interface.

As shown in FIG. 17, the second industrial robot R2 may be a six-degree-of-freedom mechanical arm or the like. The second industrial robot R2 and the first industrial robot R1 may be shared. Certainly, the second industrial robot R2 and the first industrial robot R1 may also be independent of each other. The second industrial robot R2 is configured for intermittently putting the structural solder strips 200 shown in FIG. 2A and FIG. 2B to the flexible insulating substrate 300. Meanwhile, the second industrial robot R2 may also adjust the arrangement mode of the structural solder strips 200 shown in FIG. 2A and FIG. 2B on the flexible insulating substrate 300 shown in FIG. 1C, so that a part of the connecting layer contained in the plurality of structural solder strips 200 shown in FIG. 2A and FIG. 2B is located on the flexible insulating substrate 300 shown in FIG. 1C, and two soldering portions extend out of the flexible insulating substrate 300 shown in FIG. 1C.

As shown in FIG. 17, the speed sensor 660 may be various common angular speed sensors, linear speed sensors 660, and certainly, may also be a laser velocimeter, which may be installed on the substrate unwinding device RF of the flexible insulating substrate 300 shown in FIG. 1C or other realizable positions. When the substrate unwinding apparatus RF includes a second unwinding roller, the speed sensor 660 may be installed on a drive motor of the second unwinding roller. The speed sensor 660 is configured for collecting a feeding speed of the flexible insulating substrate 300 shown in FIG. 1C.

As shown in FIG. 17, the controller 650 is further configured for controlling a time interval for the second industrial robot R2 to put the structural solder strips according to the feeding speed of the flexible insulating substrate 300 shown in FIG. 1C and a distribution interval of the structural solder strips in the flexible insulating substrate 300 shown in FIG. 1C.

During actual application, as shown in FIG. 17, the controller 650 may determine the time interval t for the second industrial robot R2 to put the structural solder strips according to the feeding speed V of the flexible insulating substrate 300 shown in FIG. 1C and the distribution interval D of adjacent two structural solder strips in the flexible insulating substrate 300 shown in FIG. 1C. Here, the feeding speed of the flexible insulating substrate 300 shown in FIG. 1C may be expressed by linear speed, angular speed or other speed signal expression related to the feeding speed of the flexible insulating substrate 300 shown in FIG. 1C. In practical applications, these speed signals may be preprocessed according to actual conditions to meet the operation requirements of the controller 650. Certainly, the time interval t for the second industrial robot R2 to put the structural solder strip may also be determined by selecting the type of the speed sensor 660. Based on this, the controller 650 controls the time interval t for the second industrial robot R2 to put the structural solder strip. It will be appreciated here that the time interval t for the second industrial robot R2 to put the structural solder strip is determined by the second industrial robot R2, which may be determined using simple logic operation circuit or existing software available to perform data preprocessing and division operation. For example, when the feeding speed V of the flexible insulating substrate 300 shown in FIG. 1C is 0.5 m/min and the distribution interval D between the two adjacent structural solder strips is 2 cm, the time interval t for the second industrial robot R2 to put the structural solder strip is D/V=4 seconds. It follows that when the speed sensor 660 and the second industrial robot R2 are respectively communicated with the controller 650, the controller 650 can receive the feeding speed of the flexible insulating substrate 300 shown in FIG. 1C collected by the speed sensor 660, control the time interval for the second industrial robot R2 to put the structural solder strips, and then improve a composite automation degree of the structural solder strips on the flexible insulating substrate 300 shown in FIG. 1C.

It can be seen from the above that the manufacturing method and the manufacturing device for the interconnection piece provided by the embodiments of the present disclosure are convenient, quick and intelligent in the process of manufacturing the interconnection piece, and can realize automatic and mass production of the interconnection piece.

In the description of the above exemplary embodiments, the specific features, structures, materials or characteristics may be combined in any one or more embodiments or examples in a suitable manner.

The foregoing descriptions are merely detailed embodiments of the present disclosure, but the protection scope of the present disclosure is not limited thereto. Any changes or substitutions that can be easily thought of by those familiar with the technical field within the technical scope disclosed in the present disclosure should be covered by the protection scope of the present disclosure. Therefore, the protection scope of the present disclosure should be subjected to the protection scope of the claims.

The above-described apparatus embodiments are merely illustrative, wherein the units that are described as separate components may or may not be physically separate, and the components that are displayed as units may or may not be physical units; in other words, they may be located at the same one location, and may also be distributed to a plurality of network units. Part or all modules therein may be selected according to actual needs to realize the objective of achieving the technical solution of the embodiment. A person skilled in the art can understand and implement the technical solutions without paying creative work.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

Many details are discussed in the specification provided herein. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "include" does not exclude elements or steps that are not listed in the claims. The word "a" or "an" preceding an element does not exclude the existing of a plurality of such elements. The present disclosure may be implemented by means of hardware including several different elements and by means of a properly programmed computer. In unit claims that list several devices, some of those apparatuses may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail by referring to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. An interconnection piece applied to back-contact cell interconnection, wherein the interconnection piece comprises: a flexible insulating substrate and a plurality of structural solder strips arranged on the flexible insulating substrate at intervals; and a material of the flexible insulating substrate comprises an insulating polymer material, wherein the insulating polymer material comprises at least one of polyvinyl butyral (PVB), polyolefin (POE) and ethylene-vinyl acetate copolymer (EVA); and each structural solder strip is provided with two soldering portions and a connecting portion located between the two soldering portions, wherein the flexible insulating substrate is internally provided with a conducting layer, and the connecting portion of each structural solder strip is positioned on the conducting layer and directly electrically contacts the conducting layer.

2. The interconnection piece according to claim 1, wherein the connecting portion is provided with a hollow structure for releasing stress, and the hollow structure comprises at least one through hole;

wherein a pattern of each through hole is a closed pattern; and/or the pattern of each through hole is a polygonal pattern, a circular pattern, an elliptical pattern or a special-shaped pattern.

3. The interconnection piece according to claim 2, wherein the hollow structure comprises m rows of through holes, and m is an integer greater than or equal to 1; and each row of through holes comprises at least one through hole, and the first row of through holes and the m-th row of through holes are formed in the connecting portion along any direction parallel to the connecting portion; and when m is an integer greater than or equal to 2, two adjacent rows of through holes are distributed in a staggered manner.

4. The interconnection piece according to claim 3, wherein central axes of the two soldering portions are collinear; and/or a width of each soldering portion is smaller than a maximum width of the connecting portion, and each soldering portion is connected to the connecting portion in an arc transition mode.

5. The interconnection piece according to claim 1, wherein the flexible insulating substrate is a light-shielding flexible insulating substrate; or at least one surface of the flexible insulating substrate is partially or completely provided with a shielding coating; or the flexible insulating substrate is a single-sided adhesive tape or a double-sided adhesive tape; or a surface of the connecting portion of each structural solder strip away from the flexible insulating substrate is exposed; or at least a part of the connecting portion of each structural solder strip is wrapped in the flexible insulating substrate.

6. A solar cell assembly, comprising the interconnection piece according to claim 1.

* * * * *